United States Patent
Nakamura et al.

(10) Patent No.: US 7,622,338 B2
(45) Date of Patent: Nov. 24, 2009

(54) METHOD FOR MANUFACTURING SEMICONDUCTOR DEVICE

(75) Inventors: Osamu Nakamura, Atsugi (JP); Junko Sato, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 701 days.

(21) Appl. No.: 11/206,787

(22) Filed: Aug. 19, 2005

(65) Prior Publication Data

US 2006/0046476 A1 Mar. 2, 2006

(30) Foreign Application Priority Data

Aug. 31, 2004 (JP) ............................ 2004-252464

(51) Int. Cl.
*H01L 21/00* (2006.01)
(52) U.S. Cl. .................... 438/165; 438/164; 438/771; 438/773; 257/E21.033
(58) Field of Classification Search ................ 438/151, 438/164, 165, 769, 771, 773
See application file for complete search history.

(56) References Cited

U.S. PATENT DOCUMENTS

| | | | |
|---|---|---|---|
| 4,595,601 A | | 6/1986 | Horioka et al. |
| 4,690,729 A | | 9/1987 | Douglas |
| 4,769,750 A | | 9/1988 | Matsumoto et al. |
| 5,530,265 A | * | 6/1996 | Takemura .................... 257/66 |
| 6,027,960 A | | 2/2000 | Kusumoto et al. |
| 6,326,221 B1 | | 12/2001 | Lee et al. |
| 6,378,995 B1 | | 4/2002 | Yun et al. |
| 6,416,583 B1 | | 7/2002 | Kitano et al. |
| 6,541,315 B2 | | 4/2003 | Yamazaki et al. |
| 6,551,867 B1 | * | 4/2003 | Ozeki et al. .................. 438/159 |
| 6,627,263 B2 | | 9/2003 | Kitano et al. |
| 6,764,967 B2 | | 7/2004 | Pai et al. |

(Continued)

FOREIGN PATENT DOCUMENTS

JP 60-249312 12/1985

(Continued)

OTHER PUBLICATIONS

Office Action (Application No. 200510103678.3) Dated Mar. 28, 2008.

(Continued)

*Primary Examiner*—Zandra Smith
*Assistant Examiner*—Christy L Novacek
(74) *Attorney, Agent, or Firm*—Eric J. Robinson; Robinson Intellectual Property Law Office, P.C.

(57) ABSTRACT

The present invention provides a method for forming a semiconductor region having a desired shape, and also provides a method for manufacturing a semiconductor device with few variations. Moreover, the present invention provides a method for manufacturing a semiconductor device which can reduce the cost with a small number of materials and with high yield. According to the present invention, after a semiconductor film is partially oxidized to form an oxide layer, the semiconductor film is etched using the oxide layer as a mask to form a semiconductor region having a desired shape, and thereafter a semiconductor device using the semiconductor region is manufactured. Thus, a semiconductor region having a desired shape can be formed in a predetermined position without using a known photolithography step using a resist.

26 Claims, 25 Drawing Sheets

U.S. PATENT DOCUMENTS

| | | |
|---|---|---|
| 6,830,856 B2 | 12/2004 | Tsai et al. |
| 6,833,327 B2 | 12/2004 | Ishikawa |
| 6,847,084 B2 * | 1/2005 | Ono et al. .................. 257/368 |
| 6,849,825 B2 | 2/2005 | Tanaka |
| 7,247,529 B2 | 7/2007 | Shoji et al. |
| 2002/0136829 A1 | 9/2002 | Kitano et al. |
| 2002/0187594 A1 | 12/2002 | Yamazaki et al. |
| 2004/0151994 A1 | 8/2004 | Tsai et al. |
| 2004/0222197 A1 | 11/2004 | Hiramatsu |
| 2004/0224446 A1 | 11/2004 | Yeh |
| 2005/0196711 A1 | 9/2005 | Shiroguchi et al. |
| 2005/0211680 A1 | 9/2005 | Li et al. |
| 2005/0226287 A1 | 10/2005 | Shah et al. |
| 2005/0276912 A1 | 12/2005 | Yamamoto et al. |
| 2006/0038174 A1 | 2/2006 | Maekawa |
| 2006/0046512 A1 | 3/2006 | Nakamura et al. |
| 2006/0211187 A1 | 9/2006 | Choi et al. |

FOREIGN PATENT DOCUMENTS

| | | |
|---|---|---|
| JP | 63-051641 | 3/1988 |
| JP | 03-024717 | 2/1991 |
| JP | 06-244184 | 9/1994 |
| JP | 08-288518 | 11/1996 |
| JP | 2000-188251 | 7/2000 |

OTHER PUBLICATIONS

Office Action (Application No. 200510103678.3) Dated Sep. 19, 2008.

Mullenborn et al., "Laser Direct Writing of Oxide Structures on Hydrogen-Passivated Silicon Surfaces," Applied Physics Letters; vol. 69, No. 20, pp. 3013-3015, Nov. 11, 1996.

Office Action (Application No. 200510103678.3) Dated Apr. 10, 2009.

* cited by examiner

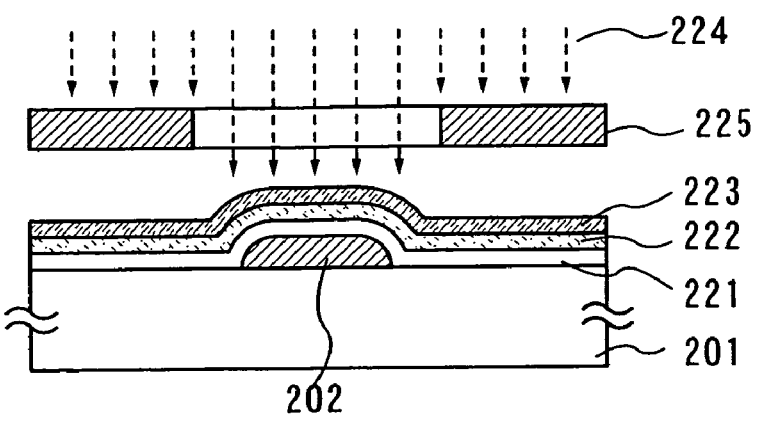
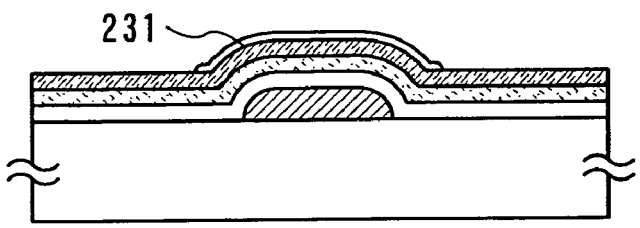
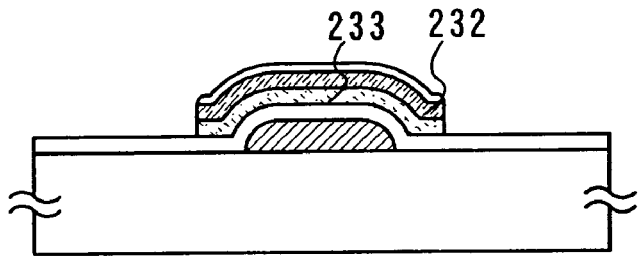
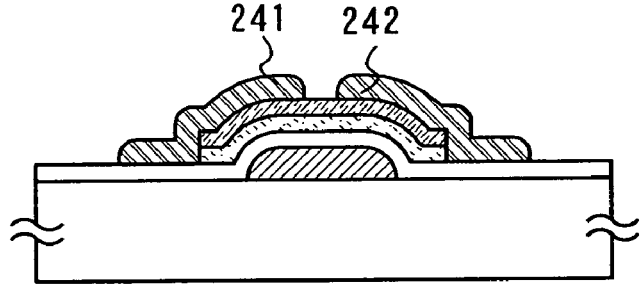
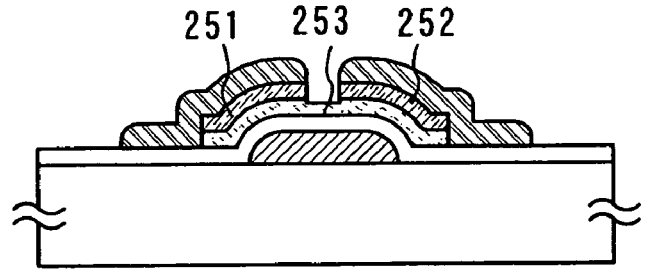

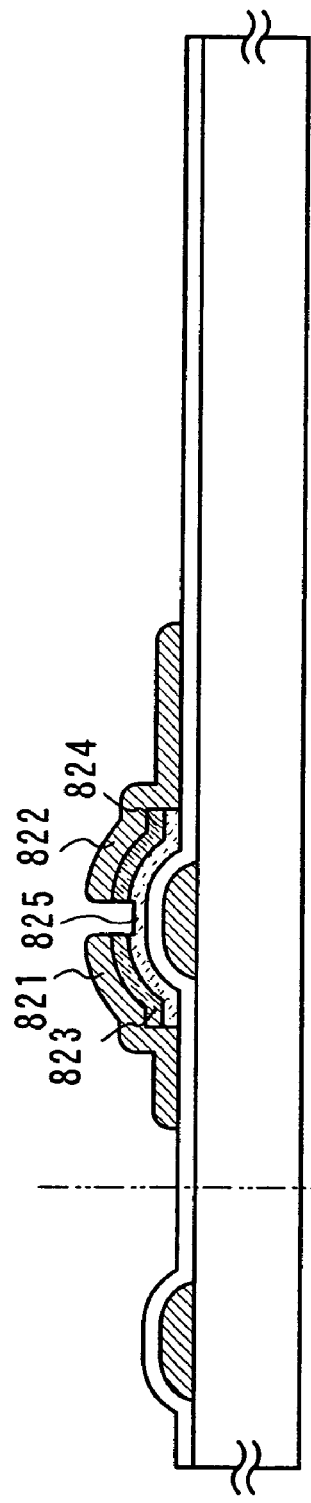
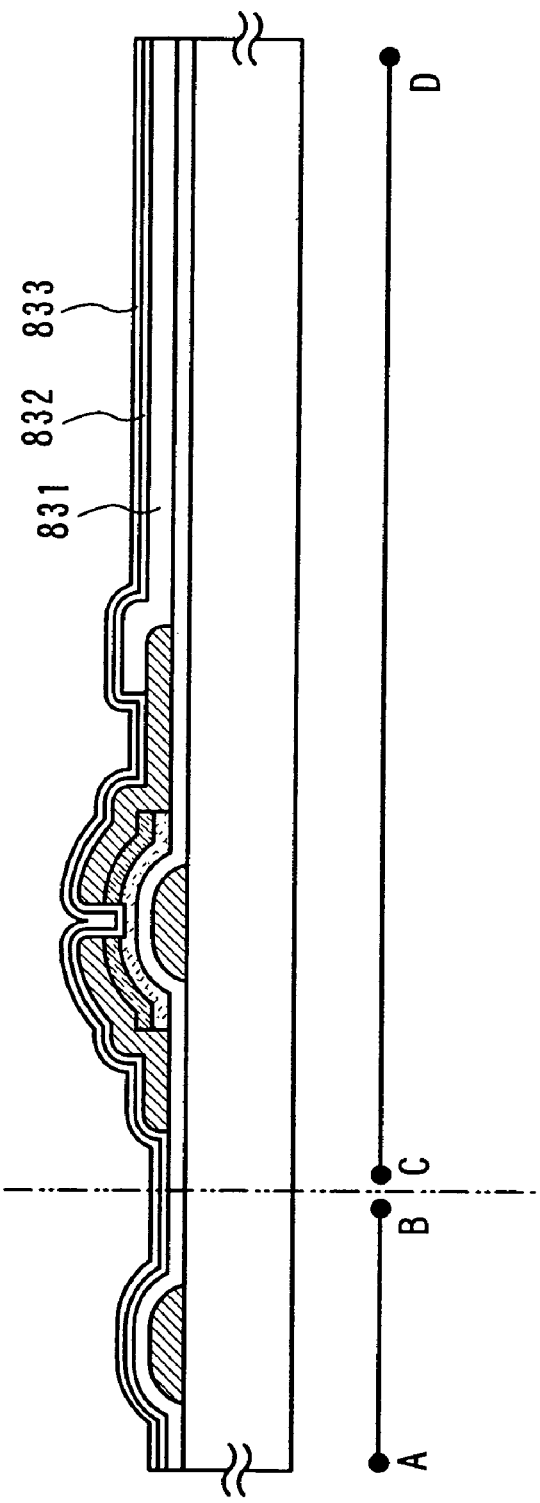
FIG. 9A
FIG. 9B

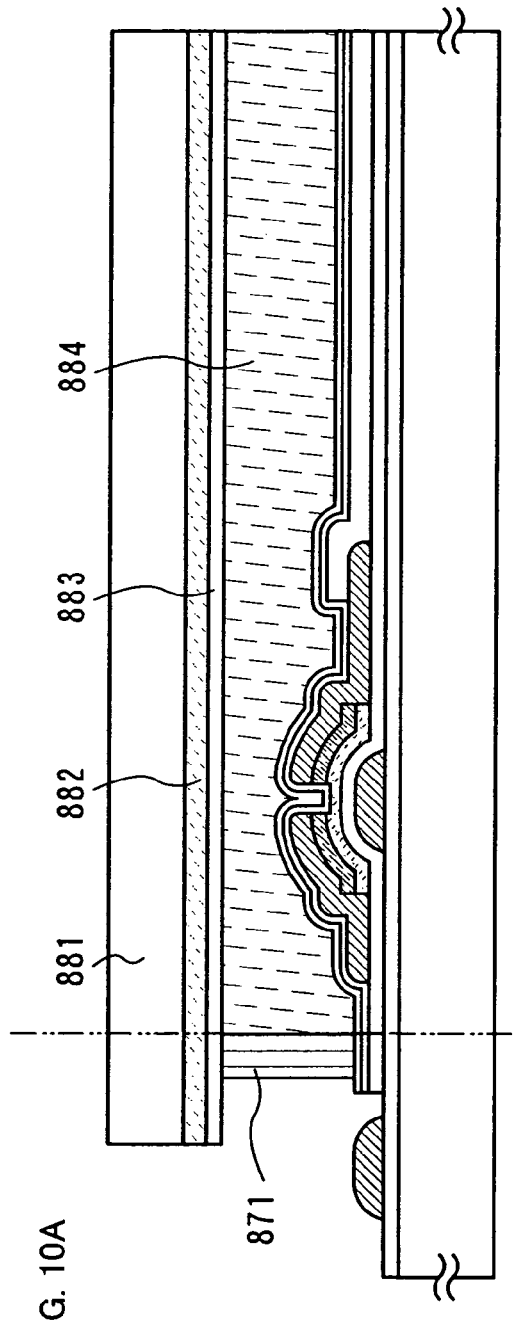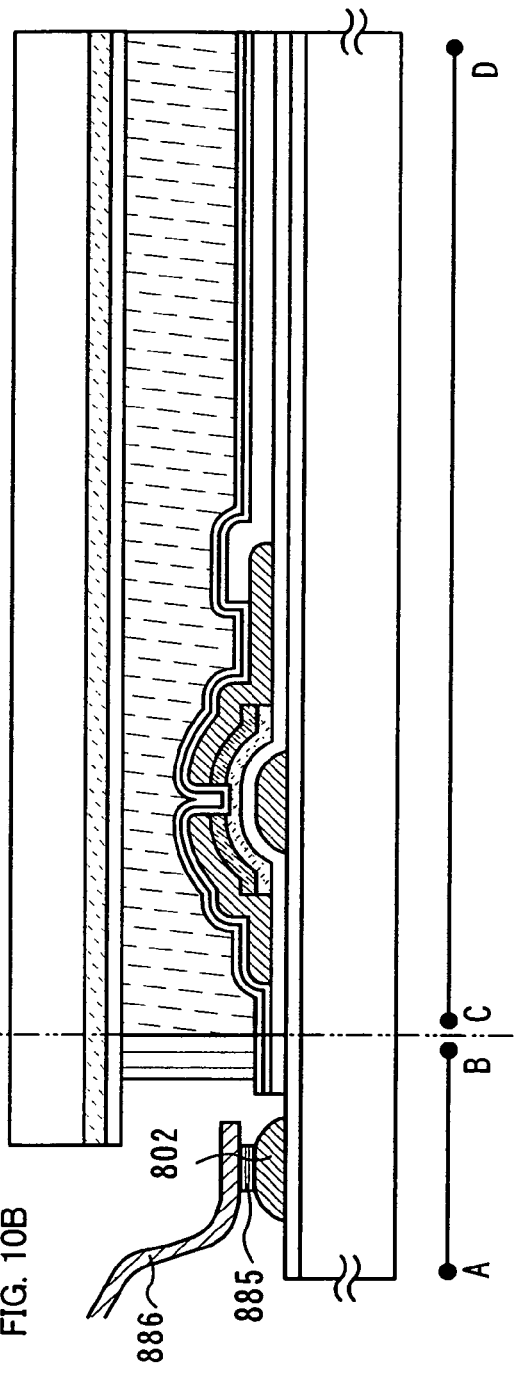
FIG. 10A
FIG. 10B

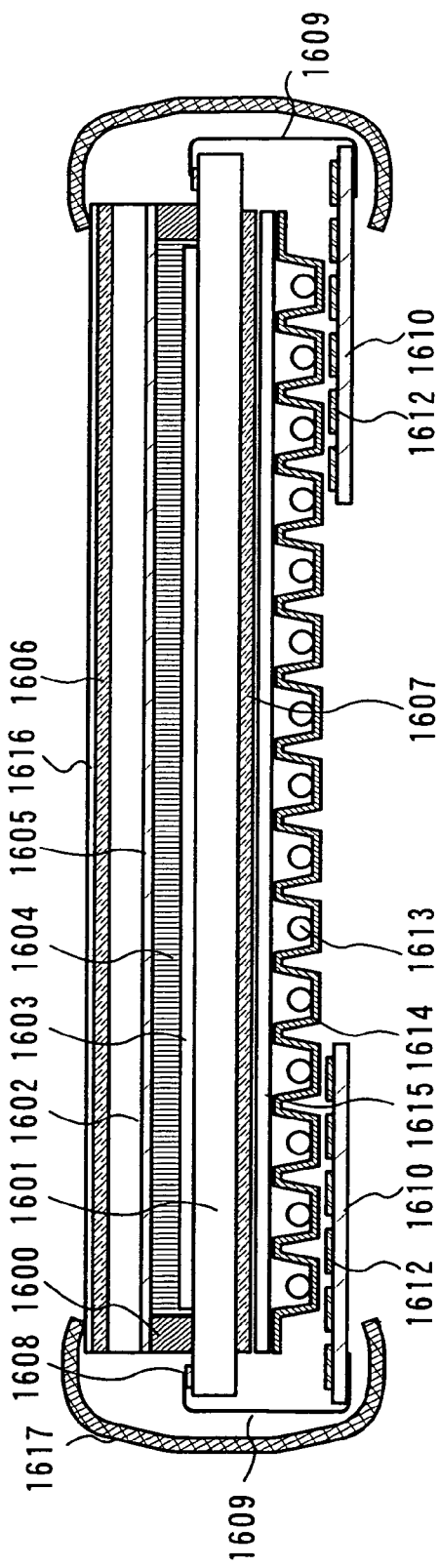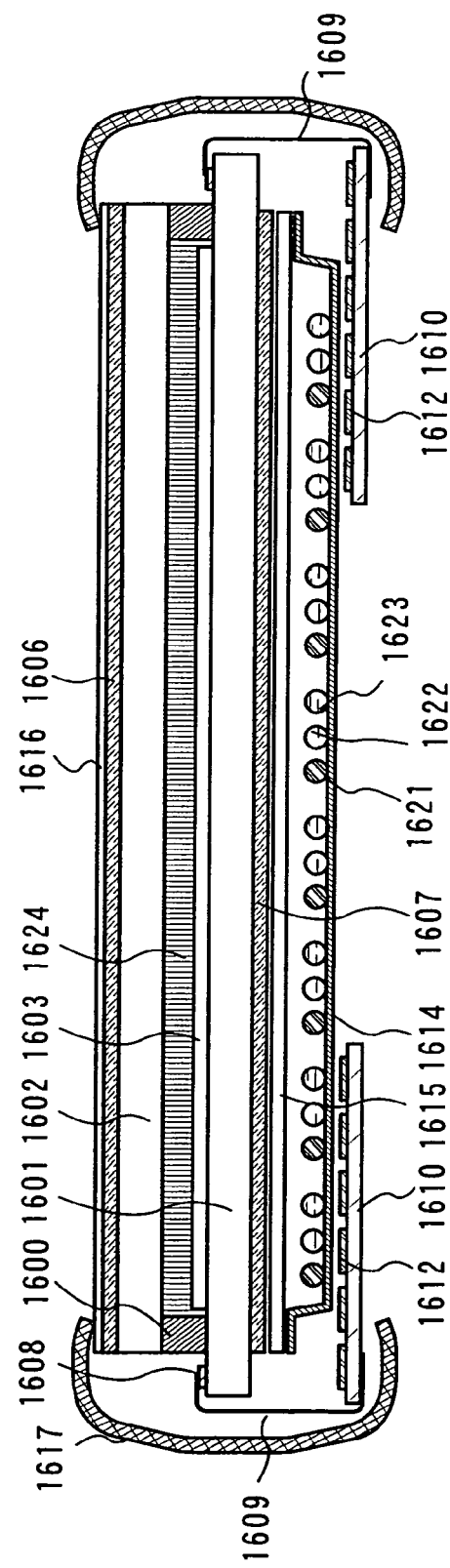

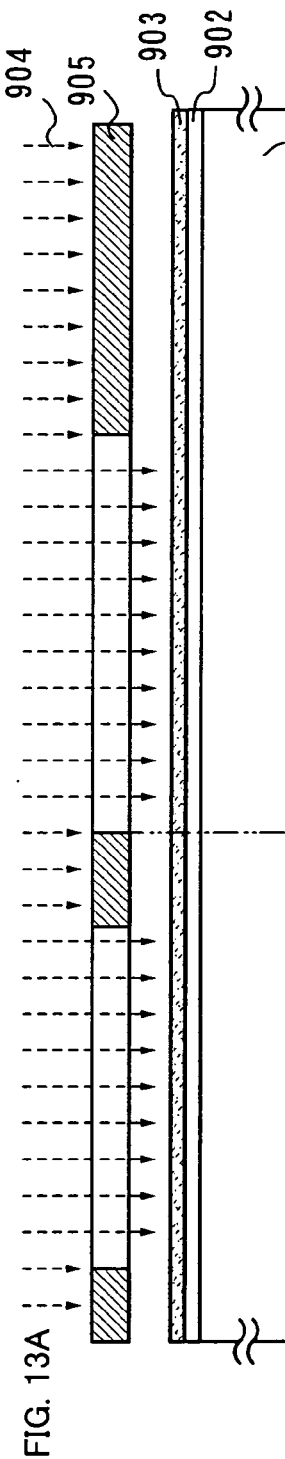
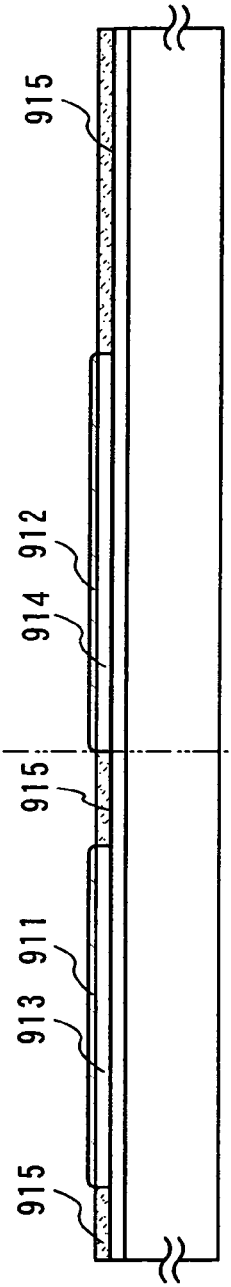
FIG. 13A
FIG. 13B
FIG. 13C

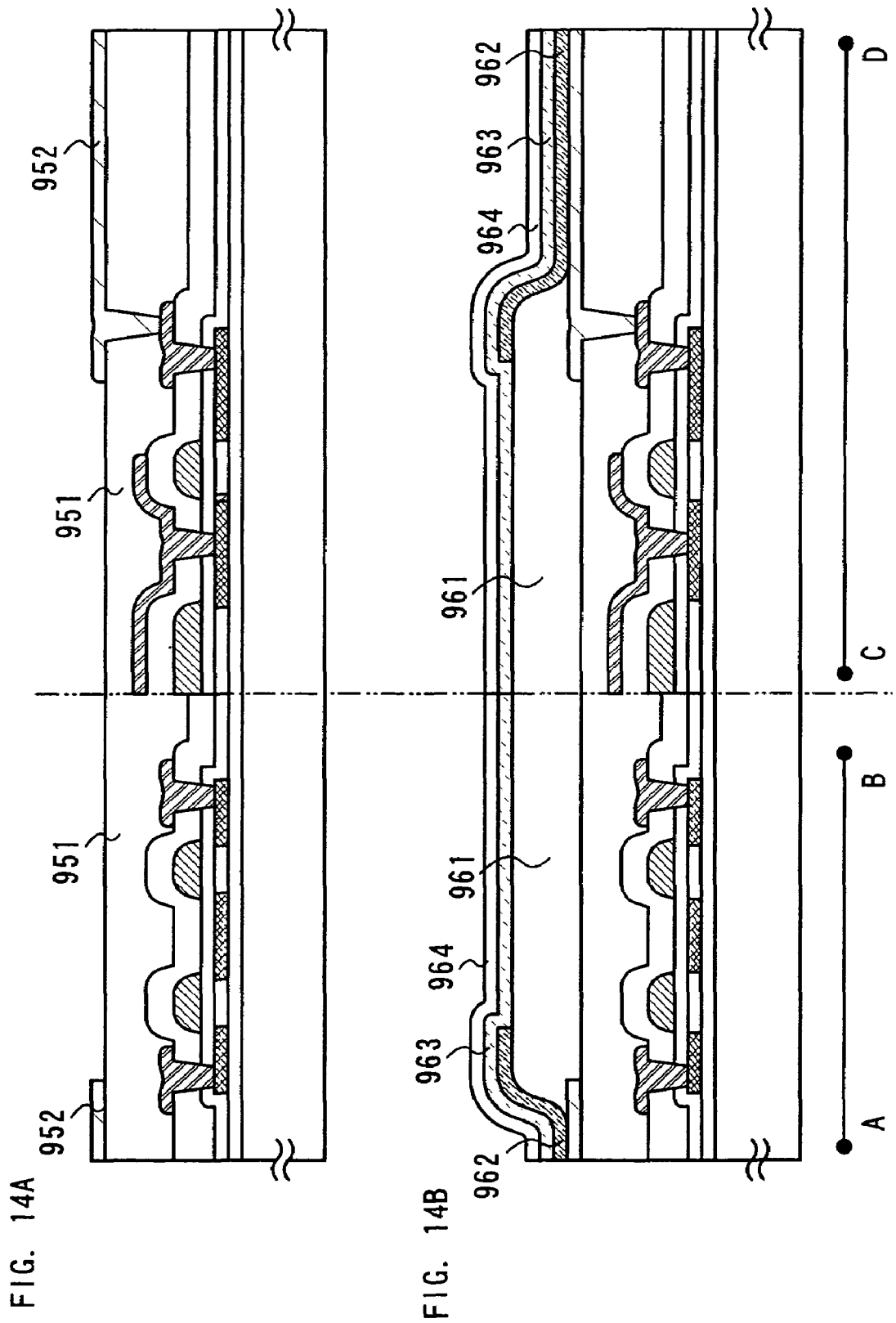

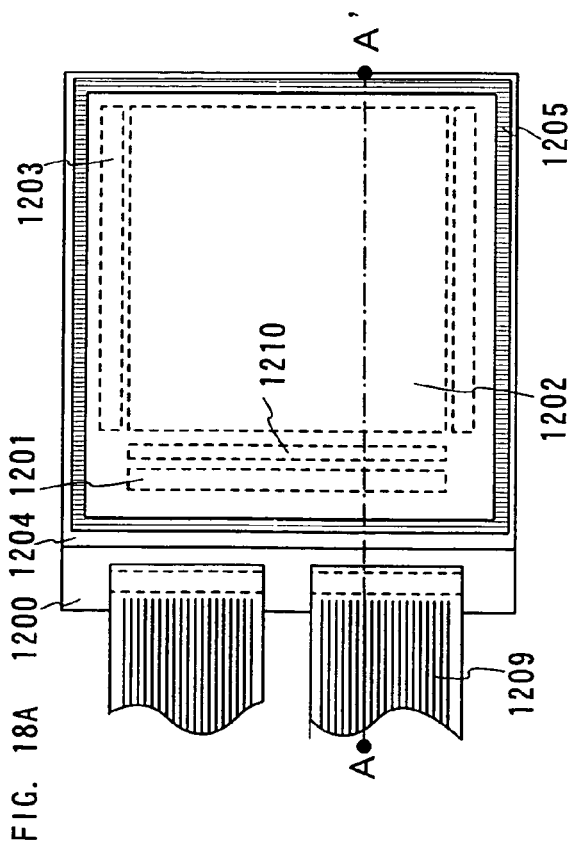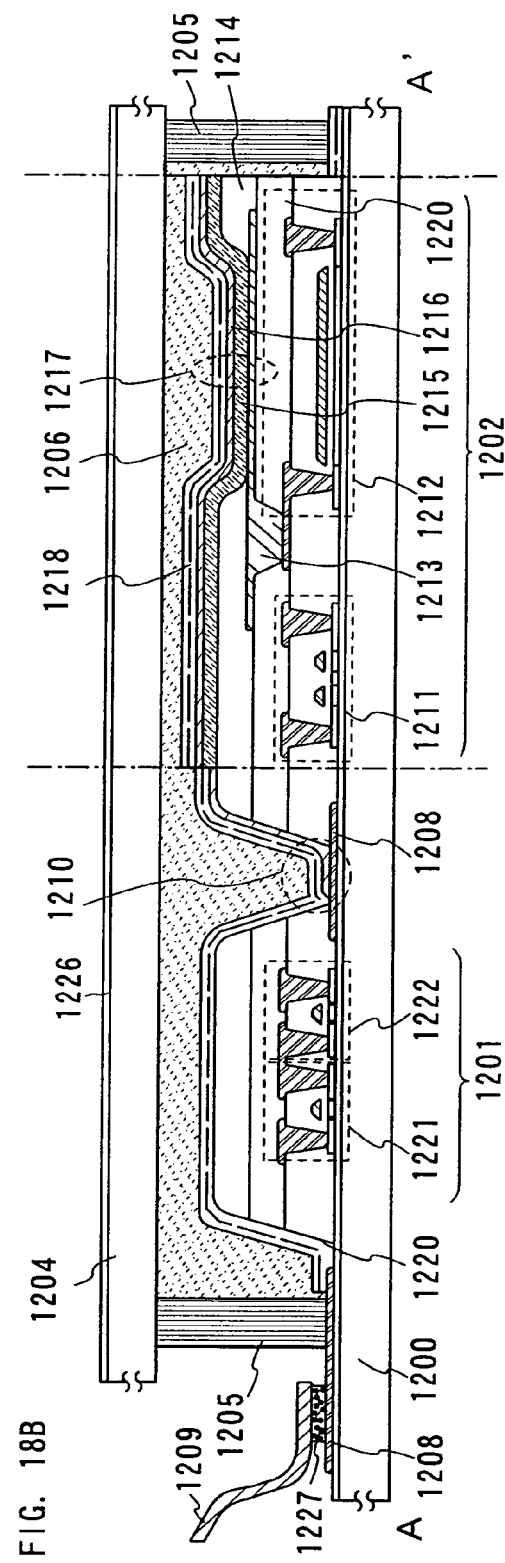
FIG. 18A
FIG. 18B

METHOD FOR MANUFACTURING SEMICONDUCTOR DEVICE

BACKGROUND OF THE INVENTION

1. Field of the Invention

The present invention relates to a method for manufacturing a semiconductor device having a semiconductor element.

2. Description of the Related Art

Conventionally, a so-called active matrix driving type display panel or a semiconductor integrated circuit including a semiconductor element typified by a thin film transistor (hereinafter also referred to as a "TFT") or a MOS transistor is manufactured by patterning various thin films through a light-exposure step (hereinafter referred to as a photolithography step) using a photomask.

In a photolithography step, a resist mask is formed by applying a resist to an entire surface of a substrate, prebaking it, irradiating the resist with an ultraviolet ray or the like through a photomask, and then developing it. After that, a thin film (a thin film formed of a semiconductor material, an insulating material or a conductive material) existing except in a portion to become a semiconductor region or a wiring is removed by etching using the resist mask as a mask to form the semiconductor region or the wiring. (Reference 1: Japanese Patent Laid-Open No. 2000-188251)

However, when a semiconductor film is etched to form a semiconductor region with a desired shape by using the conventional photolithography step, a resist is applied to a surface of the semiconductor film. At this time, there is a problem in that the surface of the semiconductor film is directly exposed to the resist, and thus the semiconductor film is contaminated with impurities such as oxygen, carbon, and a heavy-metal element contained in the resist. Such an impurity element is mixed into the semiconductor film due to this contamination, so that a property of a semiconductor element is deteriorated. Particularly, as for TFTs, there is a problem in that this contamination causes variation and deterioration of a property of the transistor.

In a process of forming a wiring or a semiconductor region using the photolithography step, there is a problem in that throughput is decreased due to a large number of steps of forming the wiring or the semiconductor region as well as the most of resist materials are wasted.

SUMMARY OF THE INVENTION

The present invention is made in view of the foregoing problems. It is an object of the present invention to provide a method for forming a semiconductor element having a semiconductor region with a desired shape without using a resist. It is another object of the present invention to provide a method for manufacturing a semiconductor device which can reduce the cost with a small number of steps. It is another object of the present invention to provide a method for manufacturing a semiconductor device which can reduce the cost by reducing a material. It is another object of the present invention to provide a method for manufacturing a semiconductor device which can increase throughput and be mass-produced. It is another object of the present invention to provide a method for manufacturing a semiconductor device with few variations.

One feature of the present invention is that after a part of a semiconductor film is oxidized to form an oxide layer, the semiconductor film is etched using the oxide layer as a mask, and thus a semiconductor region having a desired shape is formed.

Another feature of the present invention is to form a semiconductor element having the semiconductor region with a desired shape and to manufacture a semiconductor device formed of the semiconductor element.

A method for irradiating the semiconductor film with laser light through a mask having a light-transmitting portion and a light-shielding portion can be given as a method for forming the oxide layer serving as a mask on the semiconductor film.

In addition, there is a method by which a protective material is attached to a part of the semiconductor film to expose a part of the semiconductor film, and the exposed portion is soaked in an oxidizing agent having oxidizability to form the oxide layer.

The oxide layer formed on the semiconductor film is a silicon oxide film obtained by oxidizing the surface of the semiconductor film. The oxide layer and the semiconductor film can have etching selectivity in an etching step. As a result, the semiconductor film can be selectively etched using the oxide layer as a mask.

Dry etching and wet etching can be given as the method for etching a semiconductor film. At least one selected from the group of chlorine source gas typified by $Cl_2$, $BCl_3$, $SiCl_4$, $CCl_4$ or the like, fluorine source gas typified by $CF_4$, $SF_6$, $NF_3$, $CHF_3$, $ClF_3$ or the like, and $O_2$ can be used for the dry etching. Alkaline solution such as aqueous solution containing hydrazine or tetramethyl ammonium hydroxide (TMAH, chemical formula: $(CH_3)_4NOH$) can be used for the wet etching.

Linear laser light, rectangular laser light or planar laser light is preferably used as a beam spot shape of laser light.

An aspect of the present invention is a semiconductor device including a semiconductor element having the semiconductor region as an active layer. A TFT, a memory element, a diode, a photoelectric conversion element, a capacitor element, a resistor element and the like can be given as the semiconductor element. As the TFT, a staggered TFT, an inversely staggered TFT (channel-etched TFT or channel-protected TFT), and a coplanar TFT of a top gate TFT are given.

In the present invention, as a semiconductor device, an integrated circuit, a display device, a wireless tag, an IC tag and the like, each including a semiconductor element, can be given. As the display device, a liquid crystal display device, a light-emitting display device, a DMD (Digital Micromirror Device), a PDP (Plasma Display Panel), an FED (Field Emission Display), an electrophoretic display device (electronic paper) and the like can typically be given.

In the present invention, the display device indicates a device using a display element, that is, an image display device. Further, a module in which a connector, for example, a FPC (Flexible Printed Circuit), a TAB (Tape Automated Bonding) tape or a TCP (Tape Carrier Package) is attached to a display panel; a module having a printed wiring board attached to a tip of a TAB or a TCP; or a module in which an IC (Integrated Circuit) or a CPU is directly mounted on the display element by the COG (Chip on Glass) technique are all included in the display device.

According to the present invention, an oxide layer is formed on a part of a semiconductor film using a mask having a light-transmitting portion and a light-shielding portion, or a protective material, and then the semiconductor film can be etched using the oxide layer as a mask. Therefore, a semiconductor region having a desired shape can be formed over a predetermined position without using a known photolithography step using a resist.

Further, a semiconductor region having a desired shape can be formed by irradiating a semiconductor film with laser light with a large area of a beam spot such as linear laser light, rectangular laser light or planar laser light after a plurality of masks formed of an oxide layer at short times are formed. Therefore, a semiconductor device can be manufactured with high productivity.

Further, a semiconductor element with a desired shape can be formed while preventing an impurity element from being mixed into the semiconductor film due to an application of a resist. The high-integrated semiconductor device with few variations can be manufactured with high productivity. In addition, the semiconductor region having a desired shape can be formed without the photolithography step using the resist, and thus it can be formed with a small number of steps, and reduction of materials. As a result, the cost can be reduced.

When a wiring or the like is formed by using a droplet discharge method, droplets can be discharged at any positions by changing the relative position of a nozzle that is a discharge port of a droplet containing a material for the film and the substrate. In addition, depending on the nozzle size, the discharge amount of droplets, and the relative relation between the moving speed of the nozzle and a substrate, on which discharged droplets are formed, the thickness or the width of a film pattern to be formed can be adjusted. Therefore, even over a large-area substrate with 1 to 2 m or more on a side, a film pattern can be accurately formed at a desired position. Because misalignment with an adjacent film pattern is not caused, the yield can be improved. As a result, a semiconductor device can be manufactured with a small number of steps and with high yield.

Further, a liquid crystal display television and an EL display television having a semiconductor device that is formed according to the aforementioned manufacturing steps can be manufactured at low cost.

BRIEF DESCRIPTION OF THE DRAWINGS

In the accompanying drawings:

FIGS. 4A to 4E are cross-sectional diagrams showing steps of manufacturing a semiconductor device according to the present invention;

FIGS. 9A and 9B are cross-sectional diagrams showing steps of manufacturing a semiconductor device according to the present invention;

FIGS. 10A and 10B are cross-sectional diagrams showing steps of manufacturing a semiconductor device according to the present invention;

FIGS. 12A and 12B are cross-sectional diagrams showing a configuration of a liquid crystal display module according to the present invention;

FIGS. 13A to 13C are cross-sectional diagrams showing steps of manufacturing a semiconductor device according to the present invention;

FIGS. 14A and 14B are cross-sectional diagrams showing steps of manufacturing a semiconductor device according to the present invention;

FIGS. 18A and 18B are a top view and a cross-sectional diagram respectively showing a structure of a light emitting display panel according to the present invention;

DETAILED DESCRIPTION OF THE INVENTION

Figure 1A:
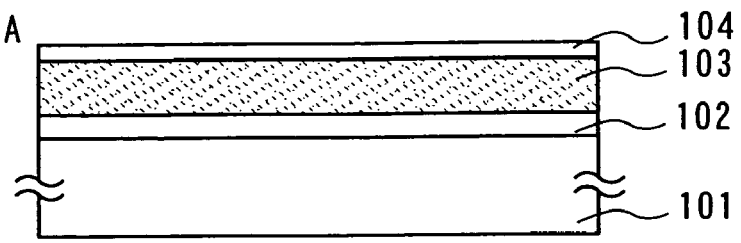
FIGS. 1A to 1E are cross-sectional diagrams showing steps of manufacturing a semiconductor region according to the present invention.

Hereinafter, Embodiment Modes according to the present invention will be described with reference to the accompanying drawings. The present invention can be carried out in many different modes, and it is easily understood by those skilled in the art that modes and details herein disclosed can be modified in various ways without departing from the spirit and the scope of the present invention. It should be noted that the present invention should not be interpreted as being limited to the description of the embodiment modes to be given below. Note that the same reference numerals are used for the same portions through all drawings and detailed description thereof is omitted.

Embodiment Mode 1

In this embodiment mode, steps of forming a semiconductor region having a desired shape by irradiation of laser light (hereinafter also referred to as a laser beam) will be described with reference to FIGS. 1A to 1E, FIGS. 22A and 22B, FIGS. 24A and 24B, and FIGS. 25A to 25C.

As shown in FIGS. 1A to 1E, a first insulating layer 102 is formed over a substrate 101, and a semiconductor film 103 is formed over the first insulating layer. When a surface of the semiconductor film 103 is exposed to oxygen, the surface of the semiconductor film is oxidized to form a second insulating layer 104 which may be called as a natural oxide.

As the substrate 101, a glass substrate, a quartz substrate, a substrate formed of an insulating material such as a ceramic such as alumina, a plastic substrate, a silicon wafer, a metal plate or the like can be given. In the case of using a glass substrate as the substrate 101, a glass substrate having a large area, e.g., 320 mm×400 mm, 370 mm×470 mm, 550 mm×650 mm, 600 mm×720 mm, 680 mm×880 mm, 1000 mm×1200 mm, 1100 mm×1250 mm, 1150 mm×1300 mm can be employed.

As typical examples of the plastic substrate, a plastic substrate formed of PET (polyethylene terephthalate), PEN (polyethylene naphthalate), PES (polyether sulfone), polypropylene, polypropylene sulfide, polycarbonate, polyetherimide, polyphenylene sulfide, polyphenylene oxide, polysulfone, or polyphthalamide, a substrate including an organic material dispersed with inorganic particles of several nanometers in diameter, and the like can be given. In addition, a surface of the substrate is not required to be flat, and may be uneven or have a curved surface.

The first insulating layer 102 is formed as a single layer or a stacked layer of silicon nitride, silicon oxide, other insulating films containing silicon by using a thin-film forming method such as a plasma CVD method, a sputtering method or the like. In addition, according to a blocking effect of impurities from a substrate and an interface property with a semiconductor region, the first insulating layer preferably has a stacked structure in which a silicon nitride film (silicon nitride oxide film), a silicon oxide film and a silicon nitride film (silicon nitride oxide film) are stacked from a side which is in contact with the substrate.

The semiconductor film 103 is formed by using a film having any state of semiconductors selected from an amorphous semiconductor, a semi-amorphous semiconductor in which an amorphous state and a crystalline state are mixed (also referred to as an SAS), and a microcrystalline semiconductor in which a crystal grain of 0.5 to 20 nm can be observed in an amorphous semiconductor. Specifically, a microcrystalline state in which a crystal grain of 0.5 to 20 nm can be observed is referred to as microcrystal (μc).

A semiconductor film can be formed to contain silicon, silicon germanium (SiGe) or the like as its main component. In addition, an acceptor element or a donor element such as phosphorus, arsenic, and boron may be contained therein. The semiconductor film has a thickness of 10 to 150 nm, preferably 30 to 70 nm.

The second insulating layer 104 is a silicon oxide film that is formed by exposing and being reacted the surface of the semiconductor film to oxygen in the atmospheric air. Therefore, the second insulting layer 104 has a thin film thickness, and has a thickness of 5 to 15 nm, typically 10 nm.

Subsequently, a third insulating layer 121 is formed. The third insulating layer 121 is an oxide layer, typically a semiconductor oxide layer. An irradiation method of laser light through a mask having a light-transmitting portion and a light-shielding portion (hereinafter referred to as a photomask), a method of soaking the semiconductor film in an oxidizing agent having oxidizability or the like can be used to form the third insulating layer 121. Note that, the third insulating layer 121 is a region in which a part of the thickness of the second insulating layer becomes thick.

A region that is not irradiated with laser light 111 remains as the second insulating layer. The second insulating layer which is exposed in the periphery of the third insulating layer is referred to as a fourth insulating layer 122. Laser irradiation is performed under an oxygen atmosphere or an air atmosphere.

Figure 25A:
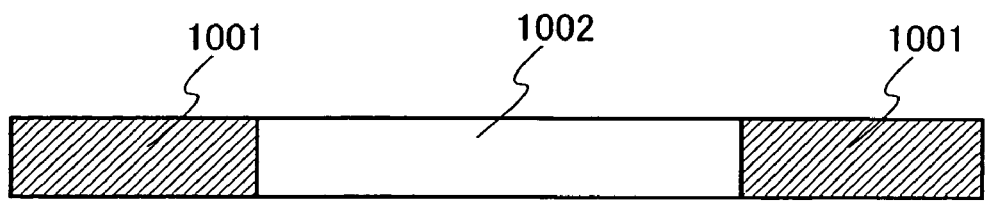
FIGS. 25A to 25C are cross-sectional diagrams showing masks which can be applied to the present invention.

Here, a photomask is described with reference to FIGS. 25A to 25C. FIG. 25A shows a mask in which both sides of a light-transmitting portion 1002 formed of a material having a light-transmitting property is adjacent to the light-shielding portions 1001 formed of a material having a light-shielding property.

The material having the light-transmitting property is a material that can transmit light having a wavelength of ultraviolet light, visible light or infrared light, preferably light of 400 to 700 nm (visible light). Typically, a glass substrate, a quartz substrate, a sapphire substrate, or a substrate formed of resin having a light transmitting property such as acrylic resin, epoxy resin, urea resin, unsaturated polyester, vinyl acetate resin, polyvinyl acetal, polystyrene, methacrylic resin, propylene, or polycarbonate can be given. Further such a substrate over which a crystalline semiconductor film is formed can be given.

On the other hand, the material having the light-shielding property is a material having the light-shielding property, that is, a material that can absorb light having a wavelength of ultraviolet light, visible light or infrared light, preferably light of 400 to 700 nm (visible light). Typically, resin in which pigment or color agent is dispersed or dissolved, polyimide, furan resin, phenol resin, other resins that absorb light having a wavelength of ultraviolet light, visible light, or infrared light can be given.

Figure 25B:
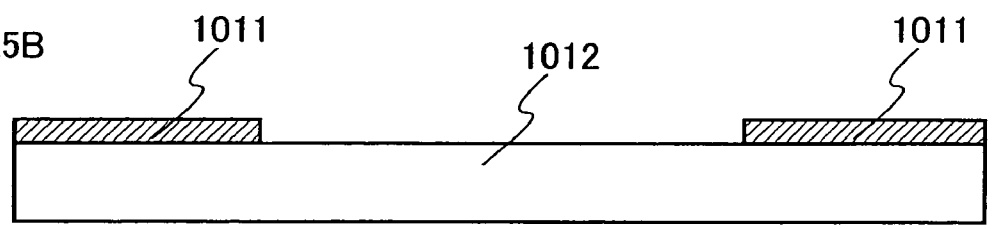

FIG. 25B shows a mask in which layers 1011 having a light-shielding property are formed over a substrate 1012 having a light-transmitting property. As the substrate 1012 having the light-transmitting property, a substrate formed of a material having the light-transmitting property in FIG. 25A can be given. As the layer having the light-shielding property, a single layer or a stacked layer of an element selected from titanium (Ti), aluminum (Al), tantalum (Ta), tungsten (W), molybdenum (Mo), copper (Cu), chromium (Cr), niobium (Nb), iron (Fe), nickel (Ni), cobalt (Co), ruthenium (Ru), rhodium (Rh), palladium (Pd), Osmium (Os), iridium (kr), silver (Ag), gold (Au), platinum (Pt), cadmium (Cd), zinc (Zn), germanium (Ge), zirconium (Zr), and barium (Ba), an alloy material mainly containing the elements, nitrogen compound, oxygen compound, carbon compound, or halogen compound can be used.

Figure 25C:
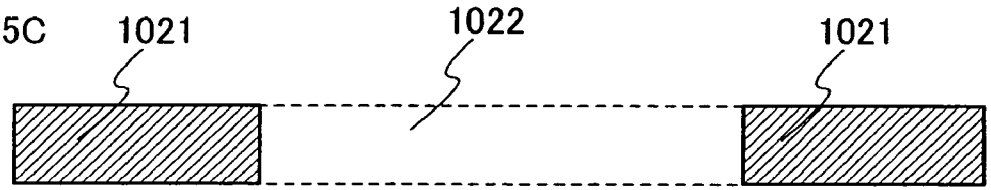

FIG. 25C shows a mask in which an opening portion 1022 is formed in the substrate 1021 having a light-shielding property. Typically, an opening portion can be formed in a substrate formed of aluminum or stainless steel.

Figure 1B:
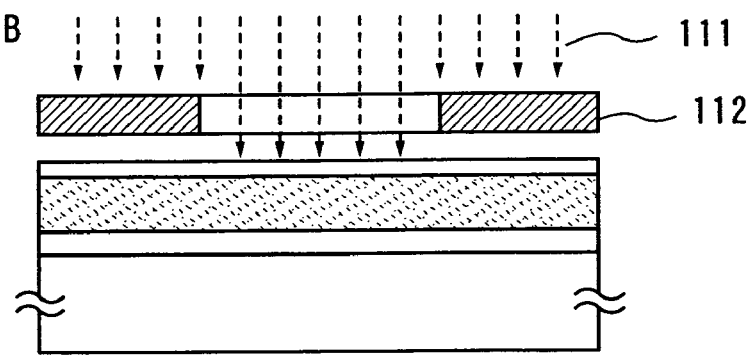
Figure 1C:
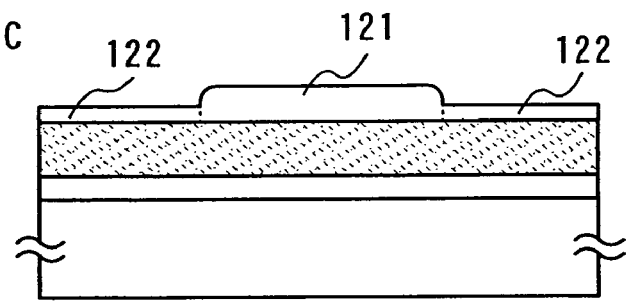
Figure 22A:
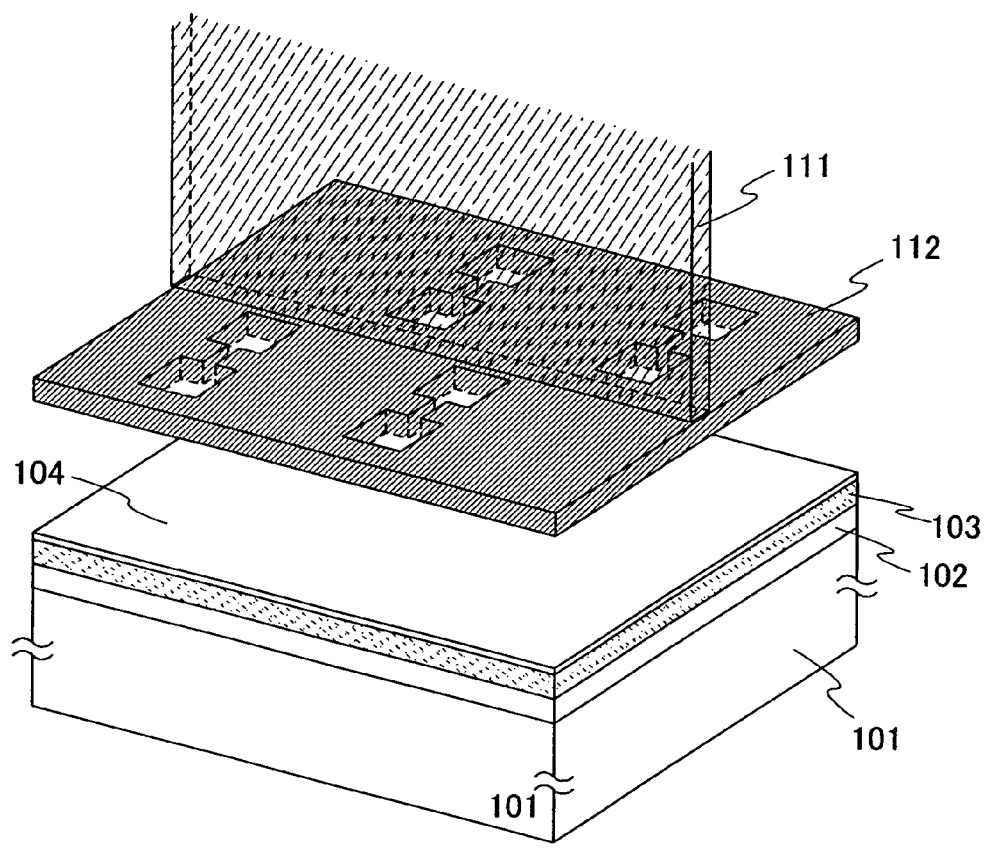
FIGS. 22A and 22B are perspective views showing steps of manufacturing a semiconductor region according to the present invention.

Here, as shown in FIG. 1B and FIG. 22A, laser light 111 is emitted from above a photomask 112, and a second insulating layer 104 formed over a semiconductor film or a surface of a semiconductor film is irradiated with the laser light that has been passed through a light-transmitting portion. As a result, as shown in FIG. 1C, the second insulating layer 104 or a semiconductor film 103 is oxidized by the energy of the laser light in a region irradiated with the laser light to form a third insulating layer 121. The film thickness of the third insulating layer 121 is preferably twice or more thicker than that of the second insulating layer 104. In addition, the third insulating layer 121 is preferably a dense insulating layer, and an etching rate of the third insulating layer 121 is smaller typically half or less than that of the second insulating layer.

In addition, the hydrogen concentration in the semiconductor film 103 is preferably reduced before the second insulating layer is irradiated with laser light. Typically, a method for forming a semiconductor film by reducing the hydrogen concentration can be given. And also, the semiconductor film 103 may be dehydrogenated by a heat treatment. The hydrogen desorption that is generated when the semiconductor film is irradiated with laser light and the roughness of the surface of the semiconductor film that is generated due to the hydrogen desorption can be reduced by reducing the hydrocarbon concentration or dehydrogenating.

As a laser oscillator 1003, a laser oscillator that can oscillate ultraviolet light, visible light, or infrared light can be used. An excimer laser oscillator of KrF, ArF, XeCl, Xe, or the like, a gas laser oscillator of He, He—Cd, Ar, He—Ne, HF, or the like, a solid laser oscillator using a crystal such as YAG, $YVO_4$, YLF, or $YAl_3$ doped with Cr, Nd, Er, Ho, Ce, Co, Ti, or Tm, a semiconductor laser oscillator of GaN, GaAs, GaAlAs, InGaAsP, or the like can be used as a laser oscillator. Further, any of second to fifth harmonics of a fundamental wave is preferably applied to the solid laser.

Continuous wave laser light or pulsed laser light can be used as laser light emitted from the laser oscillator.

A beam spot of laser light (a region irradiated with laser light in fact on a surface of an irradiation object) is preferably a linear shape having a length of 100 mm or more, a rectangular shape having several-cm-square, or a square shape or an oblong shape that is similar to a square shape. A beam spot of laser light is also preferably a planar shape that is possible to be irradiated with one shot. Throughput of the laser irradiation can be increased, and mass productivity can be increased by irradiating with laser light having such a spot shape.

Note that a term of "linear" herein used does not mean a line in a strict sense but means a rectangle (or a long ellipse) having a large aspect ratio. For example, a rectangular beam having an aspect ratio of 2 or more (preferably 10 to 10000) is referred to as a linear beam but the linear is included in a rectangular-shape.

The laser light 111 becomes reactive because the surfaces of the semiconductor film 103 and the second insulating layer 104 are activated. The laser light 111 is preferably controlled with such an intensity that an insulating layer is formed on the surface of the second insulating layer, or between the semiconductor film and the second insulating layer. As a result, the semiconductor film 103 after being irradiated with the laser light is not melted completely, and is an amorphous semiconductor film, an SAS, or μc.

Figure 1D:
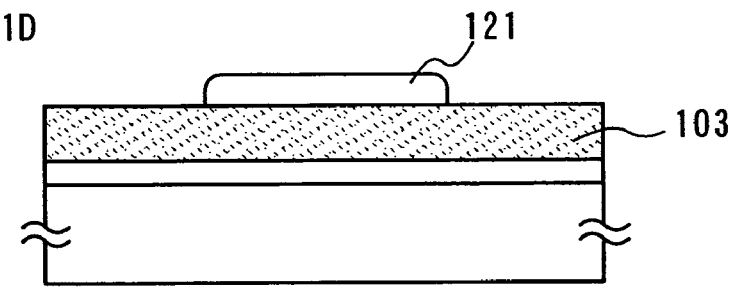

As shown in FIG. 1D, the third insulating layer is made to remain over the semiconductor film by removing the fourth insulating layer 122 and exposing a part of the semiconductor film.

As a method for removing the fourth insulating layer 122, a known method such as wet etching or dry etching is used. At this time, an etching condition is appropriately controlled so that the third insulating layer 121 remains.

Figure 1E:
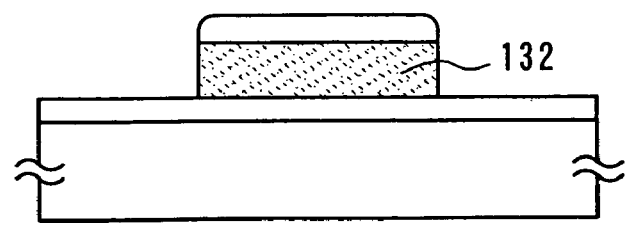

As shown in FIG. 1E, the semiconductor film 103 is etched using the third insulating layer 121 as a mask to form a semiconductor region 132 having a desired shape. As the method for etching the semiconductor film 103, dry etching and wet etching can be given. At least one selected from the group of chlorine gas typified by $Cl_2$, $BCl_3$, $SiCl_4$, $CCl_4$ or the like, fluorine gas typified by $CF_4$, $SF_6$, $NF_3$, $CHF_3$, $ClF_3$ or the like, and $O_2$ is used for the dry etching. Alkaline solution such as aqueous solution including hydrazine or tetramethyl ammonium hydroxide (TMAH, chemical formula: $(CH_3)_4NOH$) is used for the wet etching.

Figure 22B:
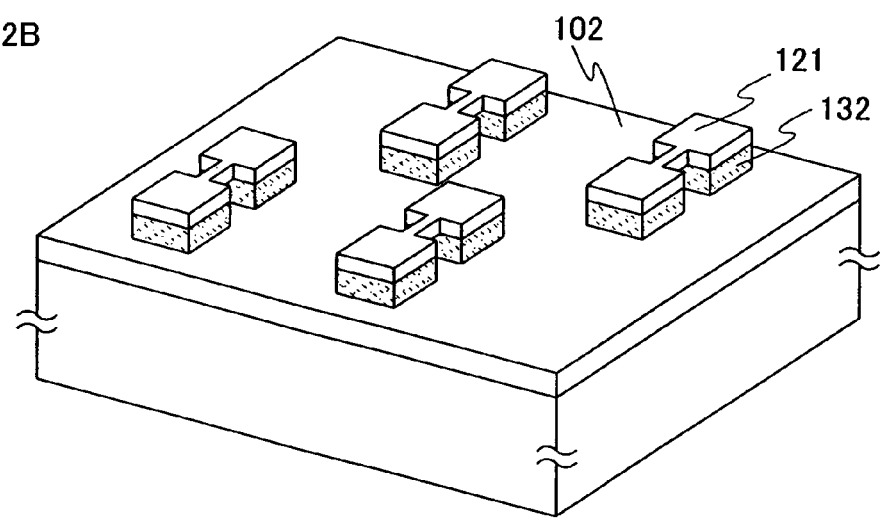

A perspective view of this mode is shown in FIG. 22B.

According to the above steps, a semiconductor region having a desired shape can be formed without using a resist.

Embodiment Mode 2

In this embodiment mode, a process of forming a semiconductor region having a desired shape by a process different from that in Embodiment Mode 1 will be described with reference to FIGS. 2A to 2E. In this embodiment mode, an order of steps of removing a second insulating layer and forming a third insulating layer is different from that in Embodiment Mode 1.

Figure 2A:
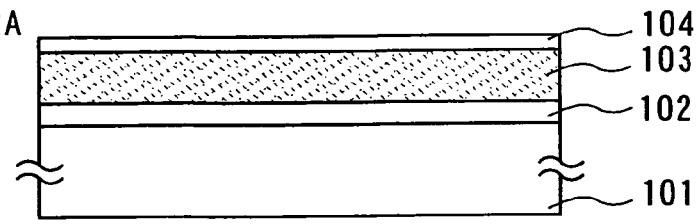
FIGS. 2A to 2E are cross-sectional diagrams showing steps of manufacturing a semiconductor region according to the present invention.

As shown in FIG. 2A, a first insulating layer 102 is formed over a substrate 101, and a semiconductor film 103 is formed over the first insulating layer in the same manner as Embodiment Mode 1. At this time, the surface of the semiconductor film 103 is oxidized to form a second insulating layer 104.

Figure 2B:
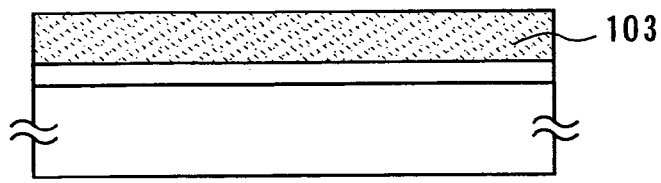

As shown in FIG. 2B, the second insulating layer 104 is removed by wet etching, dry etching or the like to expose the semiconductor film 103.

Figure 2C:
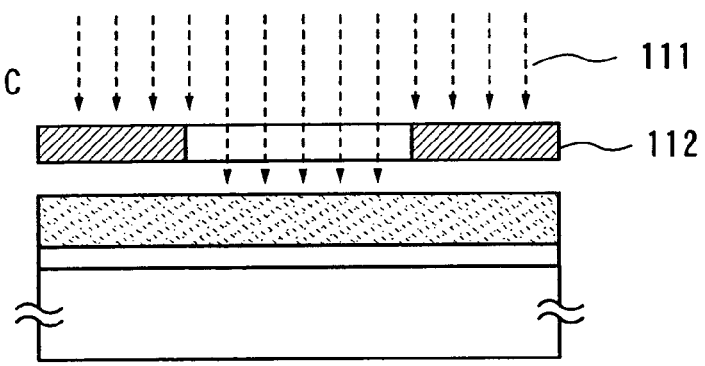
Figure 2D:
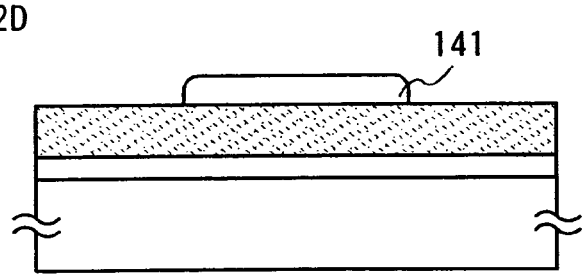

As shown in FIG. 2C, a part of the semiconductor film 103 is irradiated with laser light 111 through a photomask 112 in the same manner as Embodiment Mode 1, and as shown in FIG. 2D, a third insulating layer 141 is formed over the semiconductor film 103. The third insulating layer 141 is an oxide layer, typically a semiconductor oxide layer is given. The film thickness of the third insulating layer 141 is preferably twice or more thicker than that of the second insulating layer 104 in order to serve as a mask for etching the semiconductor film 103 afterwards. In addition, the third insulating layer 141 is preferably a dense insulating layer, and an etching rate of the third insulating layer 141 is preferably smaller typically half or less than that of the second insulating layer.

Figure 2E:
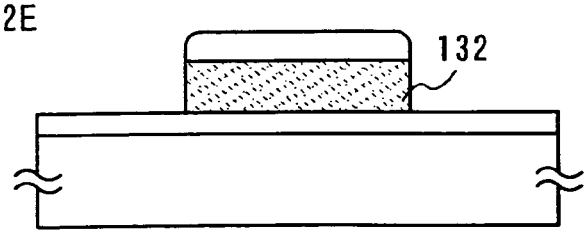

As shown in FIG. 2E, the semiconductor film 103 is etched using the third insulating layer 141 as a mask to form a semiconductor region 132.

According to the above steps, a semiconductor region having a desired shape can be formed without using a resist.

Embodiment Mode 3

In this embodiment mode, a process of forming a semiconductor region having a different crystalline state from that in Embodiment Mode 1 or Embodiment Mode 2 will be described with reference to FIGS. 3A to 3E. In addition, in this embodiment mode, while the order of steps in Embodiment Mode 1 is used to describe, the order of steps in Embodiment Mode 2 can also be used.

Figure 3A:
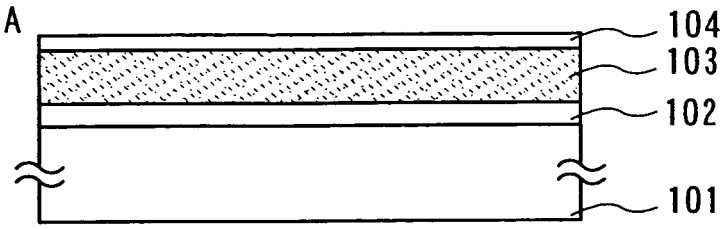
FIGS. 3A to 3E are cross-sectional diagrams showing steps of manufacturing a semiconductor device according to the present invention.

As shown in FIG. 3A, a first insulating layer 102 is formed over a substrate 101, and a semiconductor film 103 is formed over the first insulating layer in the same manner as Embodiment Mode 1. At this time, the surface of the semiconductor film 103 is oxidized to form a second insulating layer 104.

Figure 3B:
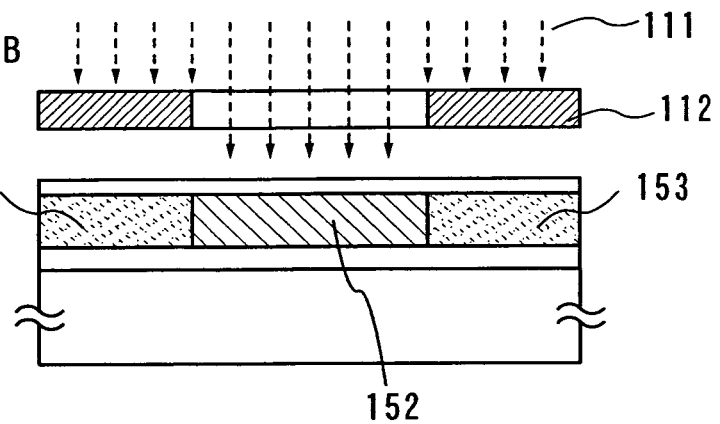

Subsequently, as shown in FIG. 3B, a part of the second insulating layer 104 is irradiated with laser light 111 through a photomask 112. At this time, a region of the semiconductor film 103 irradiated with the laser light is melted by controlling the intensity of the laser light. In addition, a semiconductor region 153 that is not melted remains in the periphery of the melted semiconductor film region 152.

Figure 3C:
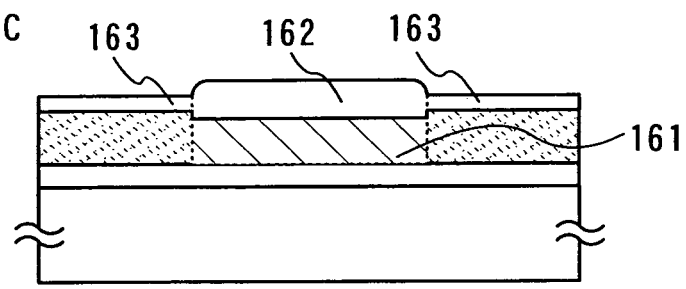

Thereafter, as shown in FIG. 3C, by naturally cooling the melted semiconductor, the semiconductor film is oxidized by the laser light irradiation to form a third insulating layer 162. At the same time, a semiconductor region 161 having crystallinity is formed. The third insulating layer 162 is an oxide layer, typically is a semiconductor oxide layer.

In addition, the second insulating layer remains in the periphery of the third insulating layer 162. Here, the second insulating layer that remains in the periphery of the third insulating layer 162 is referred to as a fourth insulating layer 163. The film thickness of the third insulating layer 162 is preferably twice or more thicker than that of the fourth insulating layer 163. The third insulating layer 162 is preferably a dense insulating layer, and an etching rate of the third insulating layer 162 is preferably smaller typically half or less than that of the second insulating layer.

Figure 3D:
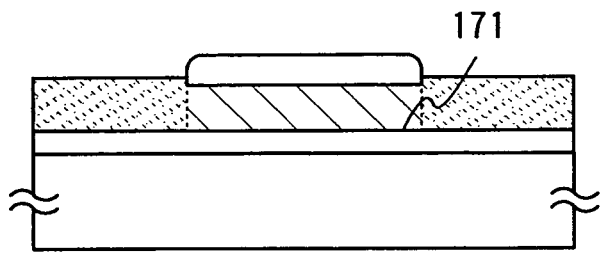

As shown in FIG. 3D, the fourth insulating layer 163 is removed by dry etching, wet etching or the like to expose the semiconductor film 103. According to this step, the third insulating layer 162 serving as a mask can be formed. Further, an etching condition is appropriately controlled so that the third insulating layer 162 can remain.

Figure 3E:
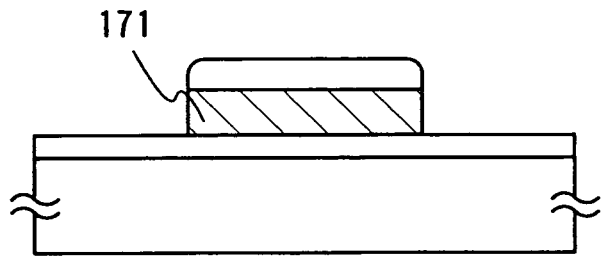

As shown in FIG. 3E, the semiconductor film 103 is etched using the third insulating layer 162 as a mask to form a semiconductor region 171 having a desired shape. As a method for etching the semiconductor film 103, the dry etching, the wet etching or the like described in Embodiment Mode 1 is appropriately used. Here, the semiconductor region 171 having crystallinity remains because the semiconductor film 103 is etched using the third insulating layer 132 as a mask.

According to the above steps, a semiconductor region having a desired shape and crystallinity can be formed without using a resist.

Embodiment Mode 4

In this embodiment mode, a method for forming a semiconductor element will be described with reference to FIGS. 4A to 4E. In this embodiment mode, a channel-etched TFT of an inversely staggered TFT is used as a typical example of a semiconductor element. In addition, in following Embodiment Modes 4 to 7, a process of forming a semiconductor element according to Embodiment Mode 2 is described; however, the present invention is not limited thereto, and Embodiment Mode 1 or Embodiment Mode 3 can be appropriately used.

As shown in FIG. 4A, a first conductive layer 202 is formed over a substrate 201. The first conductive layer 202 is formed appropriately using a material selected from a metal such as Ag, Au, Cu, Ni, Pt, Pd, Ir, Rh, W, Al, Ta, Mo, Cd, Zn, Fe, Ti, Ge, Zr, or Ba; metal nitride; ITO (indium-tin oxide alloy), ITO having silicon oxide as its composition, organic indium, organotin, or zinc oxide (ZnO) used as a transparent conductive film; or the like. As a method for forming the first conductive layer 202, a droplet discharge method, a printing method, an electrolytic plating method, a PVD method, or a CVD method is appropriately selected.

When the first conductive layer is formed by a PVD method or a CVD method, a mask is formed over a conductive film by dropping a photosensitive material by a droplet discharge method or light exposure and development of a photosensitive material using a photolithography step, or a laser beam direct writing system, and the conductive film is etched to have a desired shape by using the mask to form the first conductive layer In addition, when the second conductive layer is formed by a droplet discharge method, a composition in which the aforementioned metallic particles are dissolved or dispersed in an organic resin is discharged from a discharge port (hereinafter referred to as a nozzle). One or a plurality of organic resins selected from organic resins serving as a binder of metallic particles, a solvent, a dispersing agent, and a coating agent can be used as the organic resin. Typically, a known organic resin such as polyimide resin, acrylic resin, novolac resin, melamine resin, phenol resin, epoxy resin, silicone resin, furan resin, diallyl phthalate resin can be given.

The viscosity of the composition is preferably in the range of 5 mPa·s to 20 mPa·s so that drying can be prevented and the metallic particles can be smoothly discharged from the discharge port. The surface tension is preferably 40 mN/m or less. Further, the viscosity of the composition or the like may be appropriately adjusted in accordance with a solvent to be used and an application thereof.

The diameter of the metallic particles contained in the composition depends on the diameter of each nozzle or a shape of a desired pattern, but it is preferably made as small as possible to prevent a clogged nozzle or to manufacture a high-definition pattern. The diameter of the metallic particle is preferably 0.1 μm or less. The metallic particle is formed by a known method such as an electrolytic method, an atomizing method, and a wet reduction method, and the size of the particle is typically approximately 0.5 nm to 10 μm. However, when a gas evaporation method is employed, nanomolecule protected by a dispersing agent is minute, approximately 7 nm. When the surface of each particle is covered with a coating agent, the nanoparticles are not cohered in the solvent and are uniformly dispersed in the solvent at a room temperature, and show a property almost similar to that of a liquid.

A step of discharging the composition may be performed under low pressure because the organic resin of the composition is vaporized during a period between discharging of a composition and landing of the composition on an object to be treated, and the energy density of laser light can be decreased in a step of baking the metallic particle.

In this embodiment mode, Ag paste in which several-nm-diameter silver particles are dispersed is selectively discharged onto the substrate 201 by a droplet discharge method, and is baked to form the first conductive layer 202 in which the silver particle is baked. Conductive fine particles overlap one another irregularly three dimensionally in the first conductive layer 202. In other words, the first conductive layer 202 is constituted by three dimensional aggregate particles. Accordingly, the surface has slight unevenness. The fine particles are baked and the diameter of the particle is enlarged depending on a heating temperature and a heating time of the first conductive layer 202, and thus the conductive layer has large difference of elevation on the surface. In addition, there is a case that a region in which the fine particles are melted becomes polycrystalline. In this case, since an etching step using a mask pattern is not required, the manufacturing process can be simplified considerably.

A first insulating layer 221 serving as a gate insulating film, a first semiconductor film 222, a second semiconductor film 223 having conductivity are formed over the first conductive layer 202.

The first insulating layer 221 is formed as a single layer or a stacked layer of silicon nitride, silicon oxide, and other insulating films containing silicon by a thin-film forming method such as a plasma CVD method or a sputtering method. In addition, the first insulating layer preferably has a stacked structure in which a silicon nitride film (silicon nitride oxide film), a silicon oxide film and a silicon nitride film (silicon nitride oxide film) are stacked from a side which is in contact with the first conductive layer. In this structure, a gate electrode is in contact with the silicon nitride film, and thus deterioration due to oxidation can be prevented.

The first semiconductor film 222 is formed of a film having any state selected from an amorphous semiconductor, an SAS, μc and a crystalline semiconductor. In any case, the film mainly containing silicon, silicon germanium (SiGe) or the like can be used, and the film thickness is preferably 10 to 100 nm, more preferably 20 to 60 nm.

A crystalline semiconductor film can be formed by crystallizing an amorphous semiconductor film or an SAS by heating or laser irradiation. Alternatively, a crystalline semiconductor film may be directly formed.

Further, a crystalline semiconductor film may be formed by adding a metal catalyst such as titanium (Ti), nickel (Ni), tungsten (W), molybdenum (Mo), cobalt (Co), zirconium (Zr), tantalum (Ta), vanadium (V), niobium (Nb), chromium (Cr), platinum (Pt), and palladium (Pd) over an amorphous semiconductor film, and heating it. However, when the crystalline semiconductor film is formed by the above method, the metal catalyst is preferably removed in a later step. As a method for removing the metal catalyst, there are methods of adding an impurity (typically, argon, phosphorus, or a rare gas) to a part of the crystalline semiconductor film, heating it, and moving the catalyst element to a region in which the impurity is added; forming a semiconductor film including the aforementioned impurity on the surface of the crystalline semiconductor film, heating it and moving the catalyst element to the semiconductor film including the impurity; and the like.

The second semiconductor film 223 is formed of an amorphous semiconductor, an SAS or μc each having conductivity. In case of forming an n-channel TFT, an element belonging to Group 15 of the periodic table, typically phosphorus or arsenic, is added. In case of forming a p-channel TFT, an element belonging to Group 13 of the periodic table, typically boron, is added. The second semiconductor film is formed by a plasma CVD method using a gas having an element belonging to Group 13 or Group 15 such as boron, phosphorus, arsenic added to a silicide source gas.

After an oxide film formed on the surface of the second semiconductor film 223 is removed, a part of the second semiconductor film is irradiated with laser light 224 through a photomask 225. As a result, as shown in FIG. 4B, a second insulating layer 231 is formed. Here, a part of the second semiconductor film 223 is oxidized by the energy of the laser light to form a silicon oxide film as the second insulating layer. In addition, the second semiconductor film is not melted completely, and is an amorphous semiconductor, an SAS, or μc.

As shown in FIG. 4C, the second semiconductor film 223 is etched using the second insulating layer 231 as a mask to form a second semiconductor region 232. Then, the first semiconductor film 222 is etched using the second insulating layer 231 as a mask to form a first semiconductor region 233. Thereafter, the second insulating layer 231 is removed.

The first semiconductor film and the second semiconductor film can be etched by appropriately using the etching method for the first semiconductor film described in Embodiment Mode 1.

As shown in FIG. 4D, second conductive layers 241 and 242 serving as a source electrode and a drain electrode are formed over the second semiconductor region 232 using a conductive material. The second conductive layers 241 and 242 are formed by appropriately using the material and the forming method for the first conductive layer 202 described in this embodiment mode. Here, a solution Ag paste in which the several-nm-diameter silver particle is dispersed is selectively discharged and baked to form the second conductive layers 241 and 242.

As shown in FIG. 4E, an exposed portion of the second semiconductor region 232 is etched using the second conductive layers 241 and 242 as masks to be sectioned, thereby third semiconductor regions 251 and 252 serving as a source region and a drain region are formed. In this step, the first semiconductor region 233 in which a part thereof is etched is referred to as a fourth semiconductor region 253. The fourth semiconductor region 253 serves as a channel region.

When the fourth semiconductor region is formed of an SAS or a crystalline semiconductor film, a structure in which the third semiconductor regions serving as a source region and a drain region cover the first conductive layer serving as a gate electrode can be employed as shown in this embodiment mode. In a place of the structure, a so-called self alignment structure in which the edge portions of the third semiconductor regions and the edge portion of the first conductive layer are aligned with each other can also be employed. Further, a structure in which the third semiconductor regions are formed at a certain distance from the first conductive layer without covering the first conductive layer can be employed. This structure can reduce off-current. Thus, when the TFT is used as a switching element of a display device, the contrast can be enhanced. Further, a TFT may be formed to have a so-called multi-gate electrode structure in which the fourth semiconductor region covers a plurality of the first conductive layers. This structure can also reduce off-current.

Then, a passivation film is preferably formed over the second conductive layers 241 and 242 and the fourth semiconductor region 253. The passivation film can be formed using silicon nitride, silicon oxide, silicon nitride oxide, silicon oxynitride, aluminum oxynitride, aluminum oxide, diamond like carbon (DLC), nitrogen-containing carbon (CN), or other insulating materials by a thin-film forming method such as a plasma CVD method or a sputtering method.

According to the above steps, a channel-etched TFT having the semiconductor region with the/a desired shape can be manufactured. Further, the semiconductor device with few variations and high integration can be manufactured.

Embodiment Mode 5

In this embodiment mode, a channel-protected TFT of a bottom gate TFT as a semiconductor element will be described with reference to FIGS. 5A to 5F.

Figure 5A:
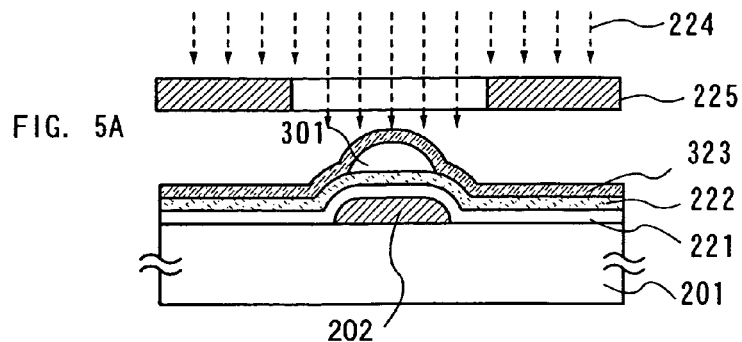
FIGS. 5A to 5F are cross-sectional diagrams showing steps of manufacturing a semiconductor device according to the present invention.

As shown in FIG. 5A, in the same manner as Embodiment Mode 4, after a first conductive layer 202 serving as a gate electrode is formed over a substrate 201, a first insulating layer 221 serving as a gate insulating film and a first semiconductor film 222 are formed. Then, a protective film 301 is formed over a region which exists on the first semiconductor film 222 and which is overlapping with the first conductive layer 202.

The protective film 301 is preferably formed by using a heat resistant high molecular weight material. The protective film 301 is preferably formed by discharging a high molecular weight material having an aromatic ring and a heterocydic ring as a main chain, and containing a heteroatom group with less aliphatic moiety and high polarity by a droplet discharge method. As a typical example of such a high molecular weight material, polyimide, polybenzimidazole, or the like can be given. When polyimide is used, the protective film 301 can be formed by discharging a solution including polyimide from a discharge port over a second semiconductor film 223, and then baking it at 200° C. for 30 minutes.

Subsequently, a second semiconductor film 323 (a semiconductor film having conductivity) is formed. Note that the second semiconductor film 323 can be formed by using the same material and the same forming method as those of the second semiconductor film 223 in Embodiment Mode 2

Figure 5B:
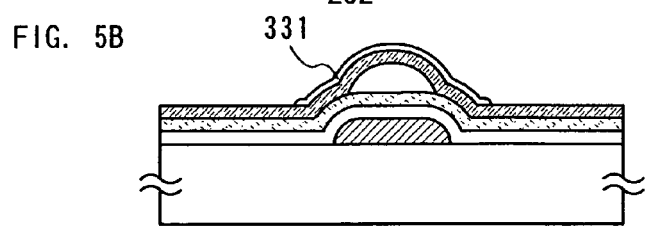

After an oxide film formed on the surface of the second semiconductor film 323 is removed, one part of the second semiconductor film 323 is irradiated with laser light 224 through a photomask 225. As a result, as shown in FIG. 5B, a second insulting layer 331 is formed. Here, one part of the second semiconductor film 323 is oxidized by the energy of the laser light, and a silicon oxide film is formed as the second insulating layer.

Figure 5C:
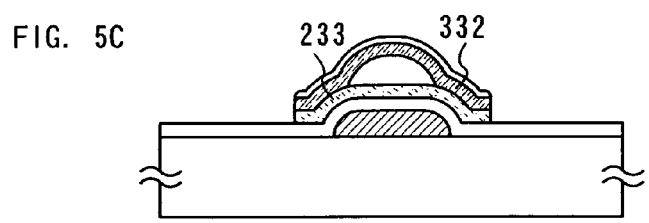

As shown in FIG. 5C, the second semiconductor film 323 is etched by using the second insulating film 331 as a mask to form a first semiconductor region 332. Then the first semiconductor film 222 is etched by using the second insulating layer 331 as a mask in the same manner as Embodiment Mode 4 to form a second semiconductor region 233. Thereafter, the second insulating layer 331 is removed.

Figure 5D:
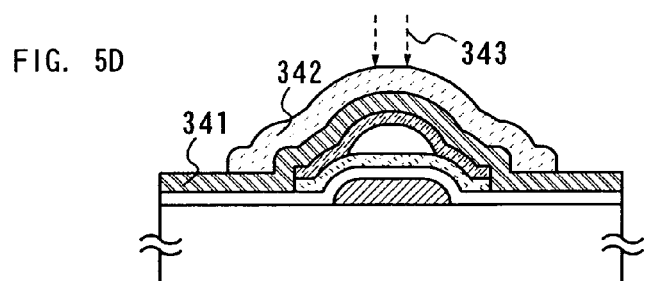

As shown in FIG. 5D, a second conductive layer 341 is formed using a conductive material. As the second conductive layer 341, a material and a method of the first conductive layer 202 shown in Embodiment Mode 4 are appropriately used. Here, the second conductive layer 341 including a stacked structure of a molybdenum film, an aluminum film and a molybdenum film by a sputtering method is formed.

After a photosensitive material 342 is discharged or applied on the second conductive layer 341, it is dried. As the photosensitive material, a negative photosensitive material or a positive photosensitive material which is photosensitive to from ultraviolet light to infrared light is used.

As the photosensitive material, a resin material having photosensitivity, such as epoxy resin, acrylic resin, phenol resin, novolac resin, melamine resin, and urethane resin is used. In addition, an organic material having photosensitivity such as benzocyclobutene, parylene, flare, and polyimide can be used. As a typical positive photosensitive material, a photosensitive material having novolac resin and a naphtho quinonediazide compound which is a photosensitive agent can be given. As a typical negative photosensitive material, a photosensitive material having a base resin, diphenyl silane diol, an acid generating agent and the like can be given. In this embodiment mode, a negative photosensitive material is used.

Figure 5E:
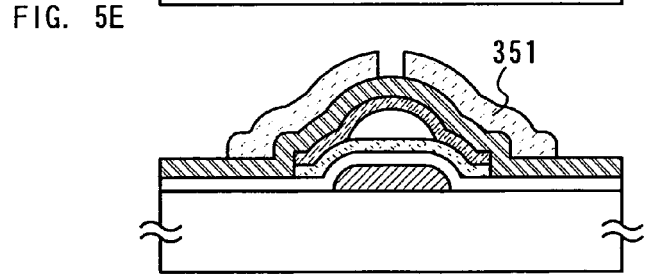

The photosensitive material 342 is irradiated with laser light 343 by using a laser beam direct writing system, exposed, and then developed. As a result, a mask 351 shown in FIG. 5E is formed.

Figure 5F:
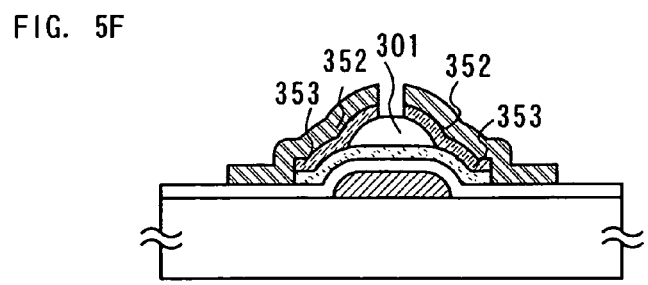

As shown in FIG. 5F, the second conductive layer 341 is etched by using the mask 351 to form third conductive layers 352 serving as a source electrode and a drain electrode. In addition, the first semiconductor region 332 is etched by using the mask 351 to form third semiconductor regions 353 serving as a source region and a drain region. According to this step, a protective film 301 is exposed.

Further, the method for forming the third conductive layers 352 serving as a source electrode and a drain electrode is not limited to this embodiment mode, and the step of forming the second conductive layers 241 and 242 shown in Embodiment Mode 4 may also be used. In addition, the step of forming the third conductive layers 352 serving as a source electrode and a drain electrode in this embodiment mode may be applied to that of the second conductive layers 241 and 242 in Embodiment Mode 4.

Thereafter, a passivation film is preferably formed over the third conductive layer 352 in the same manner as Embodiment Mode 4.

According to the above steps, the channel-protected TFT having a semiconductor region with a desired shape can be manufactured. In addition, the semiconductor device with few variations and high integration can be manufactured.

Embodiment Mode 6

In this embodiment mode, a method for manufacturing a staggered TFT of top gate TFTs will be described with reference to FIGS. 6A to 6E.

Figure 6A:
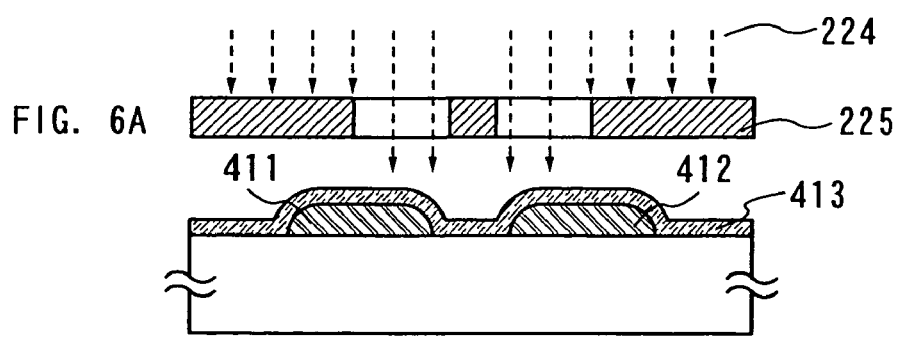
FIGS. 6A to 6E are cross-sectional diagrams showing steps of manufacturing a semiconductor device according to the present invention.

As shown in FIG. 6A, first conductive layers 411 and 412 are formed over a substrate 201. The first conductive layers 411 and 412 can be formed appropriately using the same material and the same forming method as those of the first conductive layer 202 in Embodiment Mode 4.

A first semiconductor film 413 having conductivity is formed over the first conductive layers 411 and 412. The first semiconductor film 413 can be formed appropriately using the same material and the same forming method as those of the second semiconductor film 223 shown in Embodiment Mode 4.

Figure 6B:
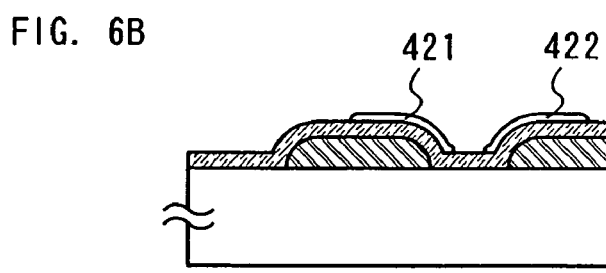

After an oxide film formed on the surface of the first semiconductor film 413 is removed, one part of the first semiconductor film 413 is irradiated with laser light 224 through a photomask 225 to form first insulating layers 421 and 422 serving as first masks as shown in FIG. 6B.

Figure 6C:
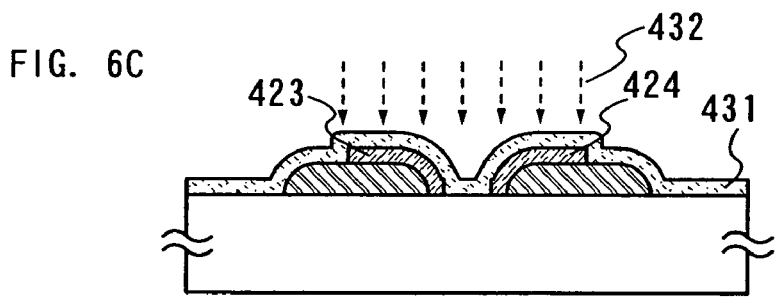

The first semiconductor film 413 is etched by using the first insulating layers 421 and 422 as masks to form first semiconductor regions 423 and 424 as shown in FIG. 6C. The first semiconductor regions 423 and 424 serve as a source region and a drain region. Subsequently, a second semiconductor film 431 is formed. The second semiconductor film 431 can be formed by appropriately using the same material and the same method as those of the first semiconductor film 222 shown in Embodiment Mode 4.

Figure 6D:
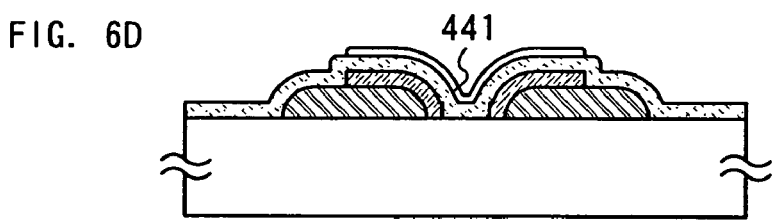

A part of the second semiconductor film 431 is irradiated with laser light 432 to form a second insulating layer 441 serving as a second mask shown in FIG. 6D.

Figure 6E:
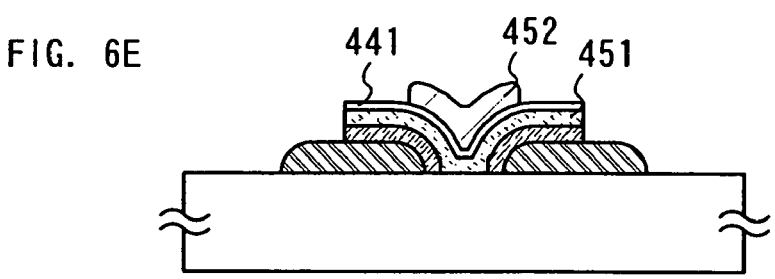

The exposed portion of the second semiconductor film is etched by using TMAH (tetramethyl ammonium hydroxide) to form a second semiconductor region 451 as shown in FIG. 6E. The second semiconductor region 451 serves as a channel region.

A second conductive layer 452 serving as a gate electrode is formed over the second insulating layer 441. The second conductive layer 452 is formed by using the same material and the same method as those of the first conductive layer 202 in Embodiment Mode 4. In addition, the second insulating layer 441 serves as a gate insulating film. After the second insulating layer 441 is removed, an insulating layer serving as a gate insulating film may be anew formed by appropriately using the same method and the same material as those of the first insulating layer 221 in Embodiment Mode 4.

According to the above steps, the channel staggered TFT having a semiconductor region with a desired shape can be manufactured. In addition, a semiconductor device with few variations and high integration can be manufactured.

Embodiment Mode 7

In this embodiment mode, a method for manufacturing a coplanar TFT among top gate TFTs will be described with reference to FIGS. 7A to 7E.

Figure 7A:
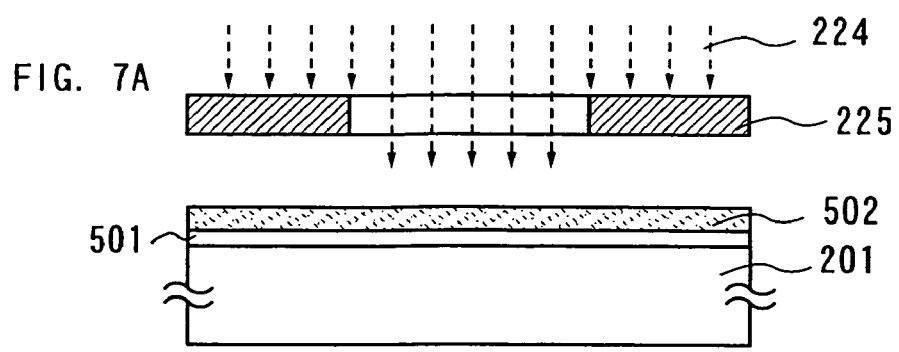
FIGS. 7A to 7E are cross-sectional diagrams showing steps of manufacturing a semiconductor device according to the present invention.
Figure 7B:
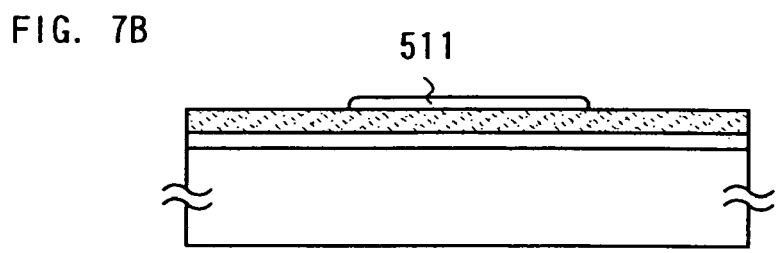

As shown in FIG. 7A, a first insulating layer 501 is formed over a substrate 201. The first insulating layer 501 serves as a blocking film to prevent impurities from the substrate from diffusing into a semiconductor region formed later Therefore, the first insulating layer 501 is formed of a silicon oxide film, a silicon nitride film, a silicon oxynitride film or the like. The first insulating layer 501 is formed to have a single layer structure or a structure in which two or more layers are stacked.

A semiconductor film 502 is formed over the first insulating layer 501. After an oxide film formed on the surface of the semiconductor film 502 is removed, a predetermined region of the semiconductor film 502 is irradiated with laser light 224 through a photomask 225 in the same manner as Embodiment Mode 4 to form a second insulating layer 511 shown in FIG. 7B.

Figure 7C:
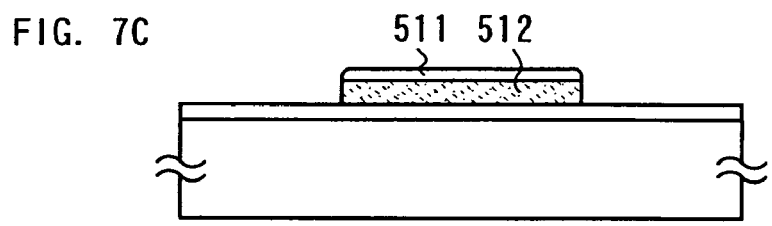

As shown in FIG. 7C, the semiconductor film 502 is etched using the second insulating layer 511 as a mask and by TMAH to form a semiconductor region 512.

Figure 7D:
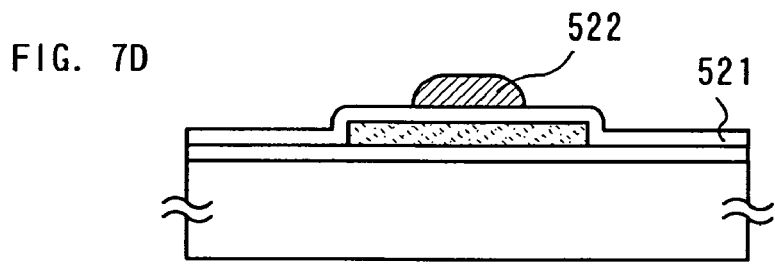

As shown in FIG. 7D, the second insulating layer 511 is removed. Subsequently, a third insulating layer 521 serving as a gate insulating film is formed over the semiconductor region 512 and the first insulating layer 501. The third insulating layer 521 can be formed by using the same materials and the same forming method as those of the first insulating layer 221 shown in Embodiment Mode 4.

A first conductive layer 522 is formed. The first conductive layer 522 can be formed by using the same material and the same forming method as those of the first conductive layer 202 shown in Embodiment Mode 4. Further, the first conductive layer 522 serves as a gate electrode.

Figure 7E:
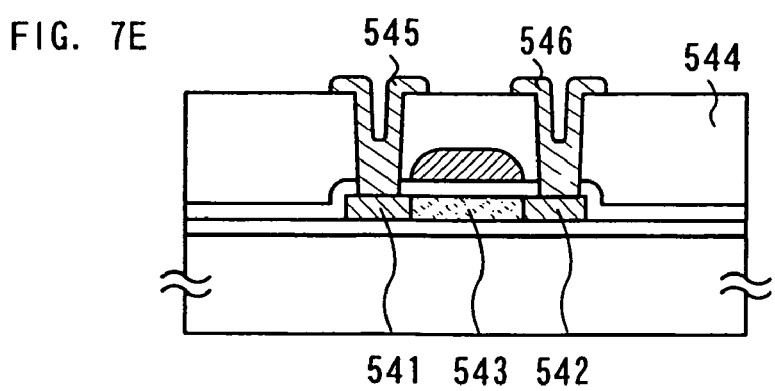

As shown in FIG. 7E, an impurity is added into the semiconductor region 512 using the first conductive layer 522 as a mask. After an insulating film containing hydrogen is formed, the impurity element added into the semiconductor region is activated by heating at 400 to 550° C. In addition, the semiconductor region is hydrogenated to form impurity regions (source and drain regions) 541 and 542. The semiconductor region covered with the first conductive layer 522 serves as a channel region 543. Further, a GRTA method, an LRTA method, or a laser annealing method can be used as the step of activation or hydrogenation in place of the heat treatment.

Further, a single-gate electrode TFT is described in this embodiment mode; however, without being limited thereto, a multi-gate electrode TFT may be used. In addition, a self-aligned TFT is described; however, without being limited thereto, an LDD (lightly dope drain) TFT or a GOLD (gate overlapped LDD) TFT can be used. In the LDD structure, a region into which an impurity element is added in low concentration is provided between a channel region and a source or a drain region formed by adding an impurity element in high concentration. The region is referred to as an LDD region. The TFT having this structure can reduce an off-current value. In the GOLD structure, the LDD region is overlapped with a gate electrode with a gate insulating film therebetween. This structure is effective in relaxing an electric field in the vicinity of the drain and preventing deterioration due to hot carrier injection.

A fourth insulating layer 544 is formed over the substrate. As a material for the fourth insulating layer, there are an inorganic insulating material such as silicon oxide, silicon nitride, silicon oxynitride, aluminum oxide, aluminum nitride, aluminum oxynitride; acrylic acid, methacrylic acid and a derivative thereof; a heat-resistant high molecular weight material such as polyimide, aromatic polyamide and polybenzimidazole; an inorganic siloxane polymer including a Si—O—Si bond of compounds containing silicon, oxygen, hydrogen formed by a siloxane polymer based material as a starting material, typified by a silica glass; an organic siloxane polymer insulting material in which hydrogen bonded with silicon is substituted by an organic group such as methyl or phenyl, typified by alkyl siloxane polymer, alkyl silsesquioxane polymer, hydrosilsesquioxane polymer, hydroalkyl silsesquioxane polymer. As a method for forming the fourth insulating layer 544, a known method such as a CVD method, a coating method, a printing method is used. When the fourth insulating layer 544 is formed by a coating method, the surface of the fourth insulating layer can be planarized, and it is suitable for a pixel electrode to be formed later. Here, the fourth insulating layer 544 is formed by a coating method.

A mask pattern is formed by a droplet discharge method. The fourth insulating layer 544 and the third insulating layer 521 are partially removed by using the mask pattern to partially expose the impurity regions 541 and 542 of the semiconductor region, and thus opening portions are formed. Second conductive layers 545 and 546 are formed in the opening portions by appropriately using the same method as that of the first conductive layer 202 in Embodiment Mode 4. The second conductive layers 545 and 546 serve as a source electrode and a drain electrode.

According to the above steps, the coplanar TFT having a semiconductor region with a desired shape can be manufactured. In addition, a semiconductor device with few variations and high integration can be manufactured.

Embodiment Mode 8

Here, a step of oxidizing a part of a semiconductor film by using a protective material will be described with reference to FIGS. 24A and 24B.

Figure 24A:
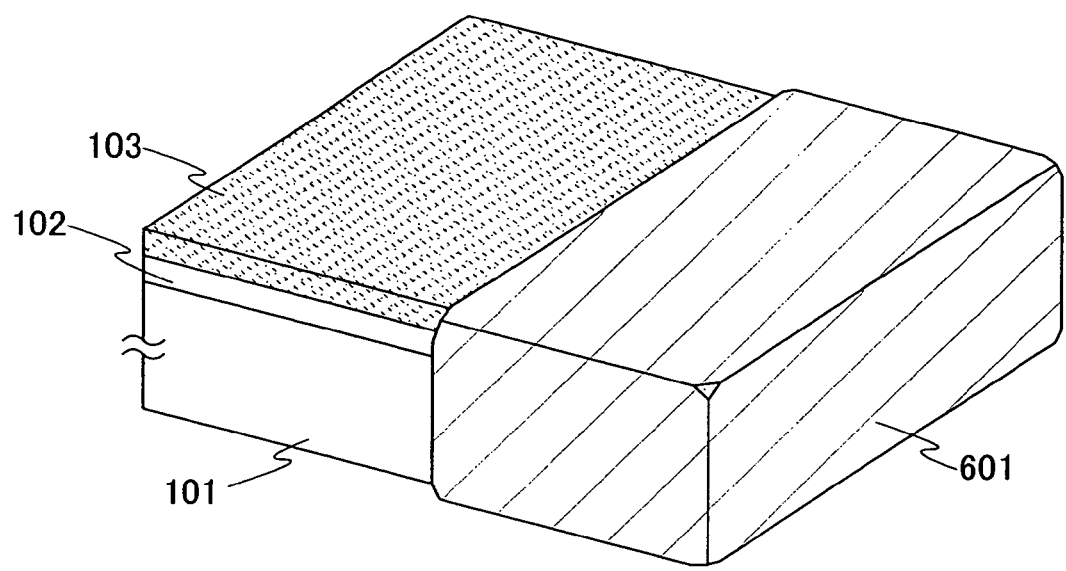
FIGS. 24A and 24B are perspective views showing steps of manufacturing a semiconductor region according to the present invention.
Figure 24B:
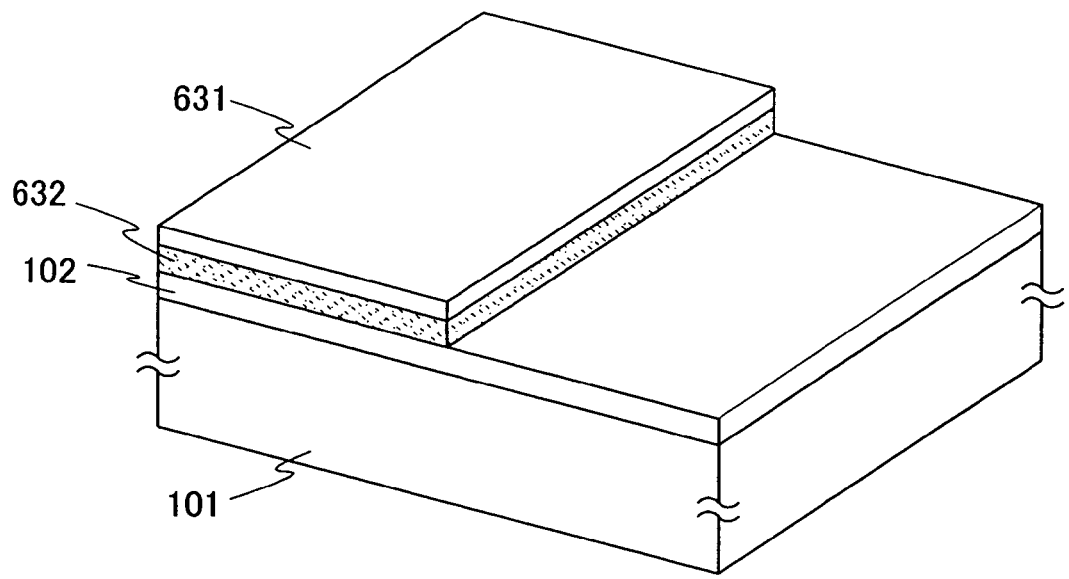

FIG. 24A is a perspective view in which an adhesive tape (hereinafter referred to as a masking tape) is attached, as a protective material, to a part of a substrate 101 over which a first insulating layer 102 and a semiconductor film 103 are formed. As a typical example of the masking tape, an organic material tape or sheet having alkali resistance or acid resistance can be given, typically a material such as polyester or polyethylene terephthalate provided with an adhesive agent may be used.

After a second insulating film formed over the surface of the semiconductor film is removed, the semiconductor film 103 and the substrate 101 are partially covered with a masking tape 601 to soak the substrate 101 in an oxidizing agent having oxidizability. As a result, as shown in FIG. 24B, a second insulating layer 631 is formed over the surface of the semiconductor film 103. As a typical example of the oxidizing agent having oxidizability, hydrogen peroxide solution ($H_2O_2$), nitric acid ($HNO_3$), ozone ($O_3$) or the like can be given.

After the masking tape is removed, the semiconductor film 103 is etched using the second insulating layer 631 as a mask to form a semiconductor region 632.

By using the masking tape, an insulating layer serving as a mask in a large region can be formed with one treatment, and thus mass productivity can be enhanced.

Further, in this embodiment mode, after the second insulating layer 631 formed over the surface of the semiconductor film is removed, the third insulating layer serving as the mask is formed in accordance with Embodiment Mode 2; however, the second insulating layer 631 may be partially removed after the third insulating layer serving as the mask is formed without removing the second insulating layer 631 as shown in Embodiment Mode 1.

Embodiment 1

Figure 11:
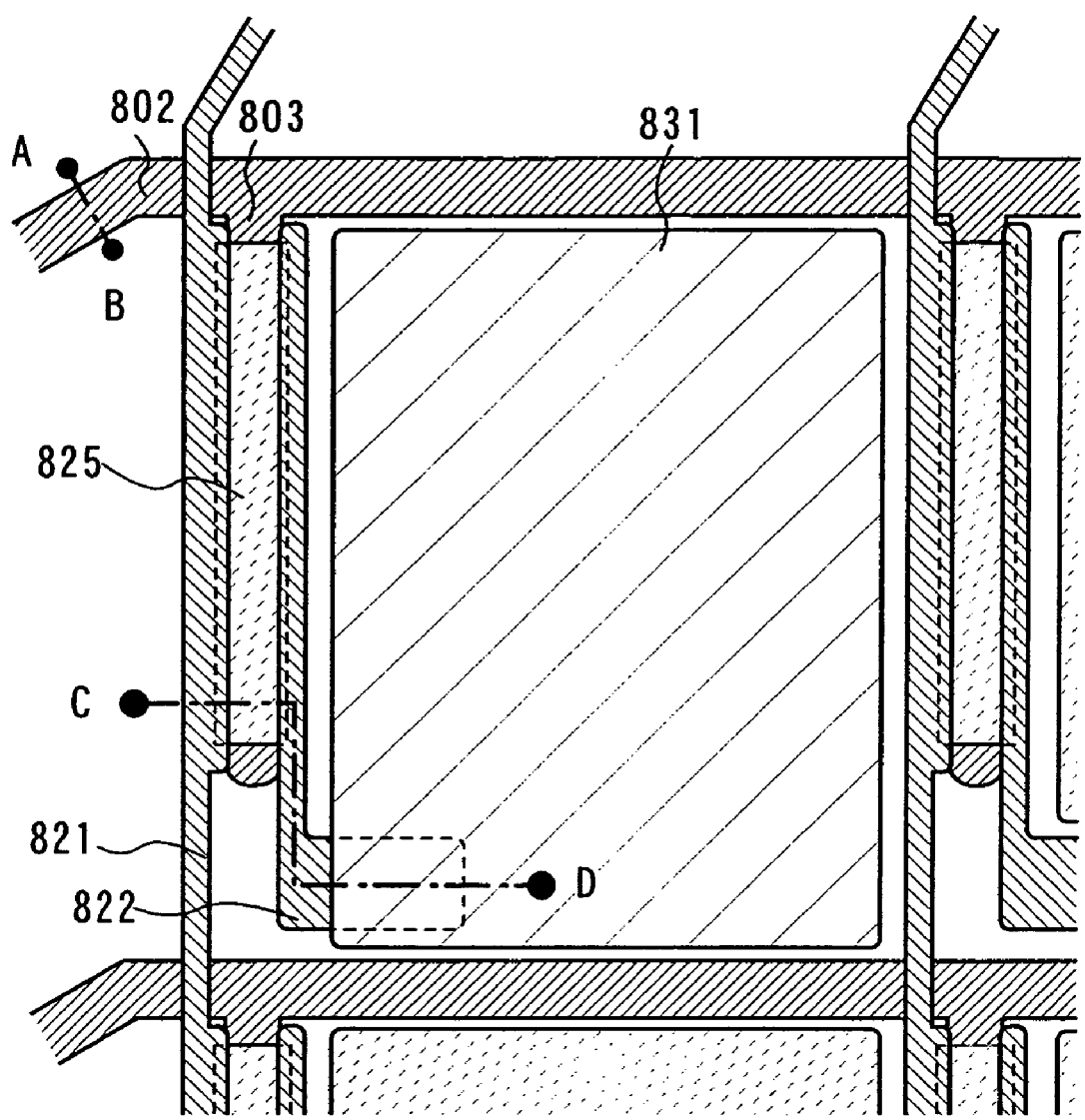
FIG. 11 is a top view showing a step of manufacturing a semiconductor device according to the present invention.

Next, methods for manufacturing an active matrix substrate and a display panel having the active matrix substrate are described with reference to FIGS. 8A to 11. In this embodiment, as a typical example of the display device, a liquid crystal display panel is used to describe. FIG. 11 is a top view of an active matrix substrate, and cross-sectional structures corresponding to a line A-B of a connecting terminal portion and a line C-D of a pixel portion are schematically described in FIGS. 8A to 10B.

Figure 8A:
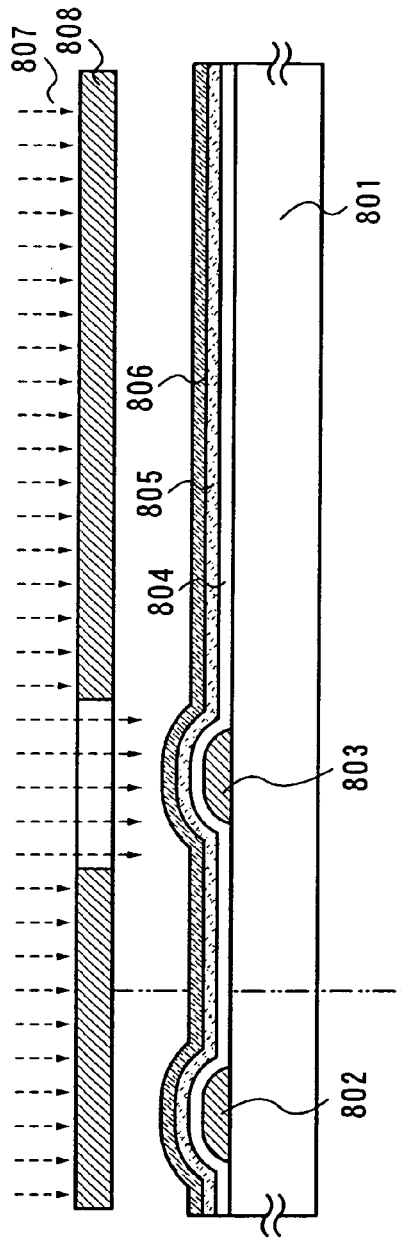
FIGS. 8A to 8C are cross-sectional diagrams showing steps of manufacturing a semiconductor device according to the present invention.

As shown in FIG. 8A, first conductive layers 802 and 803 are formed over the surface of a substrate 801. The first conductive layers are formed by discharging a composition which is formed of an organic resin, and metallic particles such as Ag, Au, Cu, Ni, Pt, Pd, Ir, Rh, W, Al, Ta, Mo, Cd, Zn, Fe, Ti, Si, Ge, Zr and Ba, and baking it. The first conducive layer 802 serves as a gate line while the first conductive layer 803 serves as a gate electrode later. Here, a glass substrate: AN100 (product of Asahi Glass Co., Ltd.) is used as the substrate 801. In addition, a composition dispersed with Ag (silver) particles is discharged by a droplet discharge method and heated to form the first conductive layers 802 and 803.

Then, a gate insulating film 804 is formed by a CVD method. As the gate insulating film 804, a silicon nitride film is formed to have a thickness of 50 nm, and then a silicon oxynitride film with a thickness of 50 nm (SiON (O>N)) is formed thereover.

Then, a first semiconductor film 805 and an n-type second semiconductor film 806 are formed. The first semiconductor film 805 is formed using an amorphous silicon film with a thickness of 150 nm. Then, after removing an oxide film on the surface of the amorphous silicon film, a semi-amorphous silicon film is formed to have a thickness of 50 nm in the same manner as the second semiconductor film 806. Here, the first semiconductor film and the second semiconductor film are formed by a CVD method.

Figure 8B:
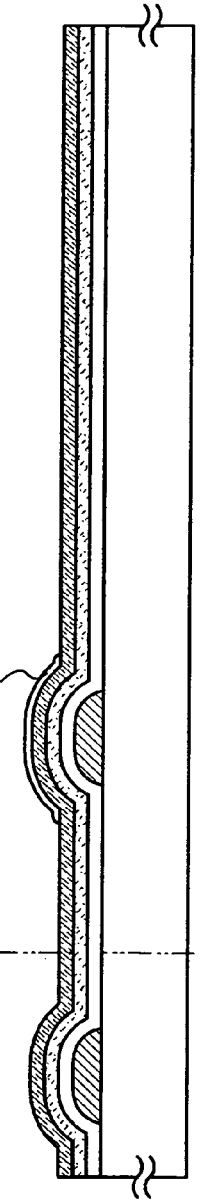

Then, after removing an oxide film formed on the surface of the second semiconductor film 806, the second semiconductor film 806 is partially irradiated with a laser beam 807 through a photomask 808, thereby a silicon oxide film 811 is formed on the surface of the second semiconductor film as shown in FIG. 8B.

Figure 8C:
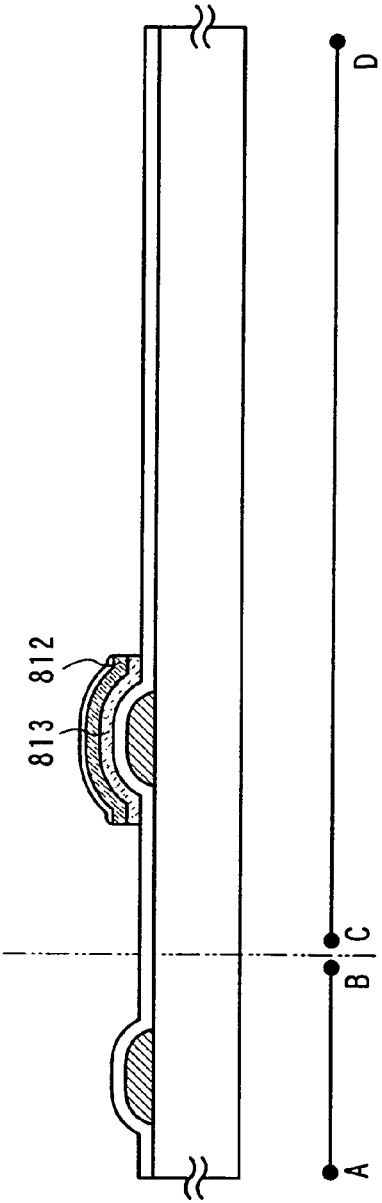

Then, as shown in FIG. 8C, the second semiconductor film 806 is etched by using the silicon oxide film 811 as a mask to form a first semiconductor region 812. Similarly, the first semiconductor film is etched to form a second semiconductor region 813. Here, the first semiconductor film and the second semiconductor film are etched using a mixed gas of $CF_4$ and $O_2$ with a flow ratio of $CF_4:O_2=10:9$. After that, the silicon oxide film 811 is removed.

Then, as shown in FIG. 9A, second conductive layers 821 and 822 are formed by a droplet discharge method. The second conductive layers 821 and 822 serve as a source line (source electrode) and a drain electrode respectively latel Here, the second conducive layers 821 and 822 are formed by discharging a composition dispersed with Ag (silver) particles, and baking it at 200° C. for 30 minutes.

Note that instead of the aforementioned steps, a conductive layer is formed over the first semiconductor region by a droplet discharge method and is baked. Then, a mask is formed by coating or discharging, baking a photosensitive material over the conductive layer, and exposing a part of the photosensitive material to laser light emitted from a laser beam direct writing system and developing it. Second conductive layers 821 and 822 may be formed by using the mask. In this case, a mask having a fine structure can be formed, thereby the distance between the source line (source electrode) and the drain electrode can be shortened.

Then, the first semiconductor region is etched using the second conductive layers 821 and 822 as masks to form third semiconductor regions 823 and 824. Third semiconductor regions 823 and 824 serve as a source region and a drain region or contact layers. At this time, the second semiconductor region is also etched. A fourth semiconductor region 825 which corresponds to the etched second semiconductor region serves as a channel region.

Then, as shown in FIG. 9B, a third conductive layer 831 serving as a pixel electrode is formed over the second conductive layer 822. As a typical example of the material for the third conductive layer 831, a conductive film having a light-transmitting property or a conductive film having a reflecting property is given. As the material for the conductive film having the light-transmitting property, there are indium tin oxide (ITO), zinc oxide (ZnO), indium zinc oxide (IZO), gallium-doped zinc oxide (GZO), indium tin oxide containing silicon oxide, and the like. In addition, as the material for the conductive film having the reflecting property, there are metals such as aluminum (Al), titanium (Ti), silver (Ag) and tantalum (Ta), a metal material containing such metals and nitrogen at a concentration of not higher than the stoichiometric composition ratio, or nitride of such metals such as aluminum nitride, titanium nitride and tantalum nitride. As the method for forming the third conductive layer 831, a sputtering method, a vapor deposition method, a CVD method, a coating method, or the like is appropriately used. Here, the third conductive layer 831 is formed by a droplet discharge method using indium tin oxide (ITO) containing silicon oxide to have a thickness of 110 nm.

According to the aforementioned steps, an active matrix substrate can be formed. Note that FIG. 11 is to be referred to in parallel, which illustrates a top structure corresponding to the cross-sectional structure of FIG. 9B along lines A-B and C-D.

Next, a protective film 832 is formed as shown in FIG. 9B. As the protective film 832, a silicon oxide film is formed by a sputtering method using a silicon target and a sputtering gas of argon and oxygen (flow rate of $Ar:O_2=1:1$) to have a thickness of 100 nm, and then a silicon nitride film is formed thereover by a sputtering method using a sputtering gas of argon and nitrogen (flow rate of $Ar:N_2=1:1$) to have a thickness of 100 nm.

Then, an insulating film is formed so as to cover the protective film 832 by a printing method or a spin coating method, and rubbed to form an alignment film 833. The alignment film 833 can be formed by an oblique vapor deposition method as well.

Then, as shown in FIG. 10A, a sealant 871 is formed to have a closed loop in the peripheral region of a pixel portion by a droplet discharge method on a counter substrate 881, over which the alignment film 883 and a second pixel electrode (counter electrode) 882 are formed. The sealant 871 may be mixed with a filler, and the counter substrate 881 may be additionally provided with a color filter or a shielding film (black matrix).

Then, a liquid crystal material is dropped into the closed loop formed by the sealant 871 by using a dispenser method (dropping method), and the counter substrate 881, over which the alignment film 883 and the second pixel electrode (counter electrode) 882 are formed, is stuck to the active matrix substrate in vacuum, followed by ultraviolet curing. Thus, a liquid crystal layer 884 filled with the liquid crystal material is formed. Further, as an alternative method for forming the liquid crystal layer 884 for the dispenser method (dropping method), a dip method (pump-up method) may be used, by which the liquid crystal material is injected by utilizing a capillary action after sticking the counter substrate to the active matrix substrate.

Then, the protective film 832 and the gate insulating film 804 at a connecting terminal portion of a gate line and a source line are partially removed to expose the connecting terminal of the gate line and the source line.

Then, as shown in FIG. 10B, a wiring substrate, typically, an FPC (Flexible Printed Circuit) (a wiring substrate 886 connected to the third conductive layer serving as a gate line) is attached through a connecting conductive layer 885. Further, a connecting portion of the wiring substrate and the connecting terminal portion are preferably sealed with a sealing resin. According to this structure, intrusion of moisture in the pixel portion from the sectional portion, which causes degradation, can be prevented.

According to the above steps, a liquid crystal display panel can be manufactured. Further, a protection circuit for preventing an electrostatic damage, typically, a diode or the like may be provided between the connecting terminal and a source wiring layer (gate wiring layer) or in the pixel portion. In this case, by manufacturing the diode with the same steps as the aforementioned TFT, and connecting the gate wiring layer of the pixel portion to a drain or source wiring layer of the diode, electrostatic damage can be prevented.

Note that any of Embodiment Modes 1 to 8 can be applied to this embodiment.

Embodiment 2

FIG. 12A illustrates a cross-sectional diagram of a liquid crystal module for displaying color images using white light and a color filter, which is in any of a TN (Twisted Nematic) mode, an IPS (In-Plane-Switching) mode, an MVA (Multi-domain Vertical Alignment) mode, an ASM (Axial Symmetric alignment Micro-cell mode), and an OCB (Optical Compensated Bend) mode.

As shown in FIG. 12A, an active matrix substrate 1601 is attached to a counter substrate 1602 with a sealant 1600. Between these substrates, a pixel portion 1603 and a liquid crystal layer 1604 are provided to form a display region.

A colored layer 1605 is required for displaying color images, and in the case of an RGB method, colored layers corresponding to the respective colors of red, green and blue are provided correspondingly to the respective pixels. Outside the active matrix substrate 1601 and the counter substrate 1602, polarizing plates 1606 and 1607 are disposed A protective film 1616 is formed on the surface of the polarizing plate 1606 to alleviate external shocks.

A connecting terminal 1608 provided on the active matrix substrate 1601 is connected to a wiring substrate 1610 through an FPC 1609. The wiring substrate 1610 is incorporated with an external circuit 1612 such as a pixel driver circuit (e.g., an IC chip, a driver IC or the like), a control circuit and a power supply circuit.

A cold-cathode tube 1613, a reflecting plate 1614, an optical film 1615 and an inverter (not shown) constitute a back light unit. With the back light unit as a light source, light is projected toward the liquid crystal panel. The liquid crystal panel, the light source, the wiring substrate, the FPC and the like are maintained and protected by a bezel 1617.

FIG. 12B is a cross-sectional diagram of a liquid crystal module capable of displaying color images by using a cold-cathode tube or a diode which emits R (Red), G (Green) and B (Blue) light without using a color filter like a field sequential mode, and by composing images by a time-division method. In comparison with FIG. 12A, the liquid crystal module has no color filter. In addition, here, cold-cathode tubes 1621 to 1623 for emitting R (Red), G (Green) and B (Blue) light are provided on the reflecting plate 1614. In addition, a controller (not shown) for controlling the emission of such cold-cathode tubes is provided. Further, a liquid crystal layer 1624 is filled with ferroelectric liquid crystals, and thus is capable of high-speed operation; therefore, images can be composed by the time-division method.

Note that images may also be composed by the time-division method using a liquid crystal alignment such as an OCB mode.

Embodiment 3

Figure 15:
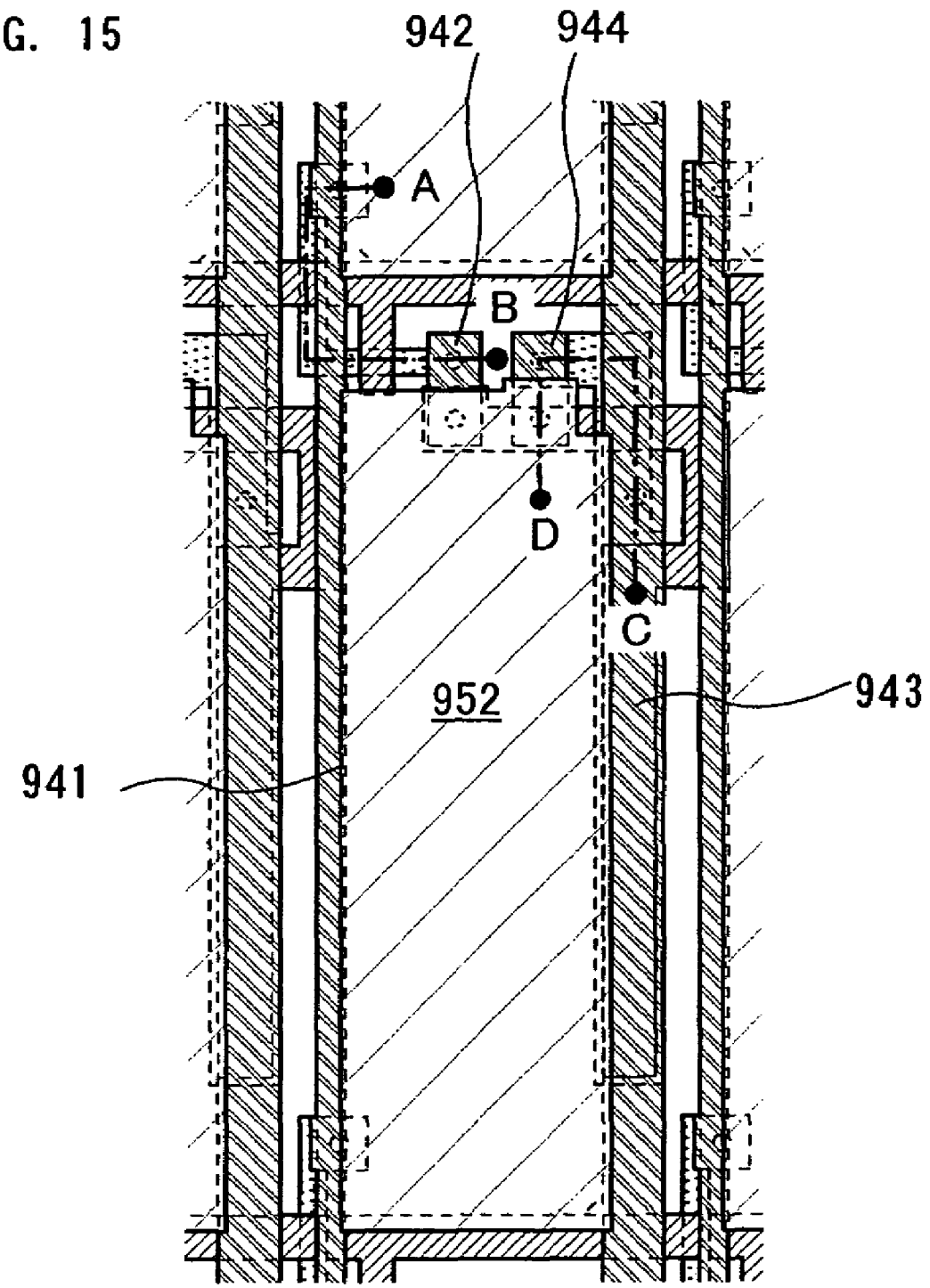
FIG. 15 is a top view showing a step of manufacturing a semiconductor device according to the present invention.

In this embodiment, a method for manufacturing a light-emitting display panel as a typical example of a display panel is described with reference to FIGS. 13A to 15. FIG. 15 illustrates a top structure of a pixel portion while FIGS. 13A to 14B are schematically illustrate cross-sectional structures corresponding to FIG. 15 along lines A-B (switching TFT) and C-D (driving TFT) of the pixel portion.

As shown in FIG. 13A, a first insulating layer 902 is formed over a substrate 901 with a thickness of 100 to 1000 nm. Here, as the first insulating layer, a silicon nitride oxide film formed by a plasma CVD method with a thickness of 100 nm and a silicon oxynitride film formed by a low-pressure thermal CVD method with a thickness of 50 nm are stacked in this order.

Next, an amorphous semiconductor film 903 is formed with a thickness of 10 to 100 nm. Here, an amorphous silicon film is formed by a low-pressure thermal CVD method to have a thickness of 50 nm. Then, after an oxide film formed on the surface of the amorphous semiconductor film 903 is removed, the amorphous semiconductor film is partially irradiated with laser light 904 through a photomask 905 to form silicon oxide films 911 and 912 as shown in FIG. 13B. At this time, a part of the amorphous semiconductor film which is irradiated with the laser light is melted, and then cooled to be crystallized. The crystallized semiconductor regions are denoted by 913 and 914, and an amorphous semiconductor region remaining on the periphery of the crystallized semiconductor regions is denoted by 915.

Next, using the silicon oxide films 911 and 912 as masks, the amorphous semiconductor region 915 is etched to form crystalline semiconductor regions 921 and 922 as shown in FIG. 13C. Then, a second insulating layer 923 serving as a gate insulating film is formed. Here, a silicon oxide film is formed by a CVD method.

Then, a channel doping step is performed over the whole surface or selectively, in which p-type or n-type impurity element is doped at a low concentration into a region to become a channel region of the TFT. This channel doping step is performed for controlling the threshold voltage of the TFT. Note that boron is doped here by ion-doping diborane ($B_2H_6$) which is excited by plasma without being separated in mass. Note that an ion implantation method in which mass separation is carried out may be used as well.

Then, first conductive layers 924 to 926 serving as gate electrodes and a first conductive layer 927 serving as a capacitor wiring are formed. Here, Ag paste is discharged by a droplet discharge method, irradiated with laser light and baked to form the first conductive layers 924 to 927.

Then, using the first conductive layers 924 to 927 as masks, phosphorus is doped into the semiconductor regions in a self-aligned manner to form high-concentration impurity regions 930 to 934. The phosphorus concentration in the high-concentration impurity regions is controlled to be in the range of $1\times10^{20}$ to $1\times10^{21}/cm^3$ (typically, $2\times10^{20}$ to $5\times10^{20}/cm^3$). Note that the crystalline semiconductor regions 921 and 922 of which the region overlaps the first conductive layers 924 to 927 become channel regions.

Then, a third insulating layer 935 is formed for covering the first conductive layers 924 to 927. Here, an insulating film containing hydrogen is formed. After that, the impurity elements added to the semiconductor regions are activated and the semiconductor regions are hydrogenated. The insulating film containing hydrogen is formed using a silicon nitride oxide film (SiNO film) which is obtained by a sputtering method.

Then, after forming opening portions which reach the semiconductor regions, second conductive layers 941 to 944 are formed. The second conductive layer 941 serves as a source line, the second conductive layer 942 serves as a first connecting wiring, the second conductive layer 943 serves as a power supply line and a capacitor wiring, and the second conductive layer 944 serves as a second connecting wiring. In this embodiment, a three-layer structure is adopted, in which a molybdenum film, an aluminum-silicon alloy film and a molybdenum film are sequentially stacked by a sputtering method, and then etched into a desired shape to form a third conductive layer.

Then, as shown in FIG. 14A, a fourth insulating layer 951 is formed. The fourth insulating layer is preferably formed of an insulating layer which can be planarized. The insulating layer which can be planarized can be formed appropriately using the same material and method as that of the fourth insulating layer 544 shown in Embodiment Mode 7. Here, an acrylic resin is formed. Note that by forming the fourth insulating layer 951 using an organic material dissolved with or dispersed with a material which absorbs visible light such as a black colorant and pigment, the stray light of a light-emitting element to be formed later can be absorbed into the fourth insulating layer. Therefore, contrast of each pixel can be improved.

Then, an opening portion is formed in the fourth insulating layer by known photolithography and etching so that the second conductive layer (the second connecting wiring) 944 is partially exposed. Then, a third conductive layer 952 is formed. The third conductive layer serves as a first pixel electrode. As the third conductive layer 952, a reflective conductive film and a light-transmitting conductive film are stacked. Here, an aluminum film containing 1 to 20% of nickel and ITO containing silicon oxide are stacked by a sputtering method. Note that aluminum containing 1 to 20% of nickel is preferably used since it does not cause electric corrosion even when it is in contact with the ITO which is the oxide. After that, the reflective conductive film and the light-transmitting conductive film are partially etched to form the third conductive layer 952.

Note that FIG. 15 is to be referred to in parallel, which illustrates a top structure corresponding to the cross-sectional structure of FIG. 14A along lines A-B and C-D.

Then, as shown in FIG. 14B, a fifth insulating layer 961 to be a bank (also referred to as a partition wall, mound or the like) is formed covering an edge of the third conductive layer 952. The fifth insulating layer is formed using a photosensitive or non-photosensitive organic material (polyimide, acrylic, polyamide, polyimide amide, resist or benzocyclobutene) or an SOG film (e.g., a $SiO_x$ film containing an alkyl group) in the thickness range of 0.8 μm to 1 μm. When the fifth insulating layer is formed using a photosensitive material, the side face thereof has a continuously variable curvature radius, which is preferable in that a thin film of the upper layer can be formed continuously.

Alternatively, the fifth insulating layer may be formed using a light-shielding insulator obtained by dissolving or dispersing a material which absorbs visible light, such as a pigment and a black colorant into the aforementioned organic material. In this case, the fifth insulating layer serves as a black matrix; therefore, it can absorb the stray light from the light-emitting element to be formed later. As a result, contrast of each pixel is improved. Further, if the fourth insulating layer 951 is also formed of an insulator having a light-shielding property, a light-shielding effect can be obtained more effectively along with the fifth insulating layer 961.

Next, a layer 962 containing a light-emitting substance is formed over the surface of the third conductive layer 952 and the edge of the fifth insulating layer 961 by a vapor deposition method, a coating method, a droplet discharge method or the like. After that, a fourth conductive layer 963 serving as a second pixel electrode is formed over the layer 962 containing a light-emitting substance. Here, ITO containing silicon oxide is formed by a sputtering method. As a result, a light-emitting element can be formed using the third conductive layer, the layer containing a light-emitting substance and the fourth conducive layer. Each material for the conductive layers and the layer containing a light-emitting substance which constitutes the light-emitting element is appropriately selected, and the thickness thereof is also controlled.

Note that before forming the layer 962 containing a light-emitting substance, a heat treatment is performed at 200° C. in the atmospheric pressure to remove moisture absorbed inside or on the surface of the fifth insulating layer 961. It is preferable that the heat treatment be performed at 200 to 400° C., or more preferably at 250 to 350° C. under the low pressure, followed by the formation of the layer 962 containing a light-emitting substance by a vacuum vapor deposition method or a droplet discharge method under the low pressure without being exposed to the atmospheric air.

A light-emitting element formed of the aforementioned materials emits light when a forward bias is applied. A pixel of a display device formed using a light-emitting element can be driven by a simple matrix method or an active matrix method. In either case, each pixel is controlled to emit light by being applied with a forward bias at specific timing whereas the pixel is in the non-emission state for a certain period of time. By applying a reverse bias in the non-emission period, the reliability of the light-emitting element can be improved. As a degradation mode of the light-emitting element, there is a degradation that the luminance intensity is decreased under a constant drive condition, or a degradation that apparent luminance is decreased due to the enlarged non-emission region in the pixels. By performing AC drive in which a forward and reverse bias are applied, degradation speed can be retarded, resulting in the improvement of the reliability of the light-emitting device.

Next, a light-transmitting protective layer 964 for blocking out the intrusion of moisture is formed to cover the light-emitting element. The light-transmitting protective layer 964 may be formed of a silicon nitride film, a silicon oxide film, a silicon oxynitride film (a SiNO film (composition ratio: N>O) or a SiON film (composition ratio: N<O)), a thin film containing carbon as a main component (e.g., DLC film or a CN film) or the like which is formed by a sputtering method or a CVD method.

According the above steps, a light-emitting display panel can be manufactured. Note that a protection circuit for preventing an electrostatic damage, typically, a diode or the like may be provided between the connecting terminal and a source wiring layer (gate wiring layer) or in a pixel portion. In this case, by manufacturing the diode through the same steps as that of the aforementioned TFT, and connecting the gate wiring layer of the pixel portion to a drain or source wiring layer of the diode, electrostatic damage can be prevented.

Embodiment 4

A mode of a light-emitting element which can be applied in the aforementioned embodiments is described with reference to FIGS. 16A to 16F.

Figure 16A:
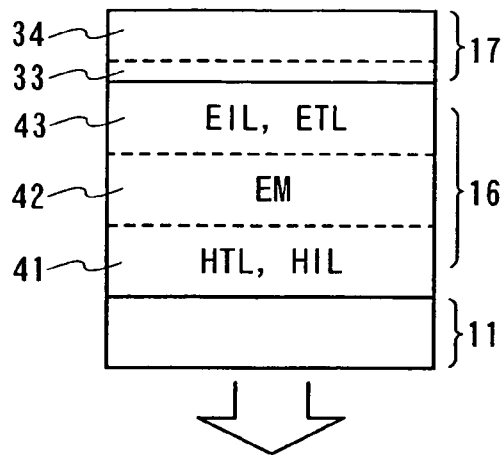
FIGS. 16A to 16F are diagrams showing configurations of light emitting elements which can be applied to the present invention.

FIG. 16A illustrates an example in which a first pixel electrode 11 is formed of a light-transmitting conductive oxide material containing silicon oxide at a concentration of 1 to 15 atomic %. Over the first pixel electrode 11, a layer 16 containing a light-emitting substance is formed, which has stacked layers of a layer 41 including at least a hole-transporting layer (HTL) and a hole-injecting layer (HIL), a light-emitting layer 42 and a layer 43 including at least an electron-injecting layer (EIL) and an electron-transporting layer (ETL). In the case of the layer 41 and the layer 43 including both the HTL and the HIL, and both the EIL and the ETL respectively, the HTL and the EIL is preferably formed over the HIL and the ETL respectively. Over the layer 16, a second pixel electrode 17 is formed, which has stacked layers of a first electrode layer 33 containing an alkaline metal or an alkaline earth metal such as LiF and MgAg, and a second electrode layer 34 formed of a metal material such as aluminum. This pixel structure allows light to be emitted from the first pixel electrode 11 side as shown in the arrow in the drawing.

Figure 16B:
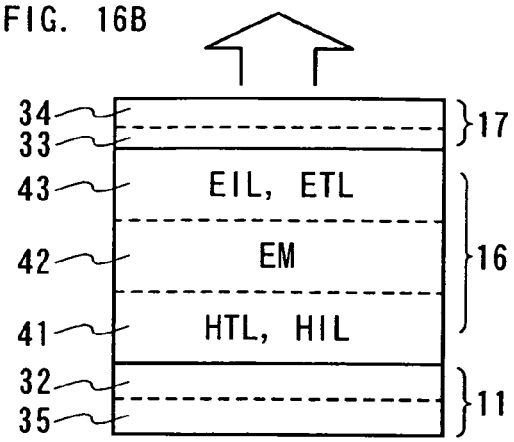

FIG. 16B illustrates an example in which light is emitted from the second pixel electrode 17 side, and the first pixel electrode 11 has stacked layers of a first electrode layer 35 formed of a metal such as aluminum and titanium or a metal material containing such a metal and nitrogen at not higher than the stoichiometric composition ratio, and a second electrode layer 32 formed of a conductive oxide material containing silicon oxide at a concentration of 1 to 15 atomic %. Over the first pixel electrode 11, the layer 16 containing a light-emitting substance is formed, which has stacked layers of a layer 41 including at least a hole-transporting layer (HTL) and a hole-injecting layer (HIL), a light-emitting layer 42 and a layer 43 including at least an electron-injection layer (EIL) and an electron-transporting layer (ETL). In the case of the layer 41 and the layer 43 including both the HTL and the HIL, and both the EIL and the ETL respectively, the HTL and the EIL is preferably formed over the HIL and the ETL respectively. Over the layer 16, the second pixel electrode 17 is formed, which has stacked layers of the third electrode layer 33 containing an alkaline metal such as LiF and CaF or an alkaline earth metal, and the fourth electrode layer 34 formed of a metal material such as aluminum. By forming each layer not to be thicker than 100 nm to transmit light, light can be emitted from the second pixel electrode 17 side.

Figure 16C:
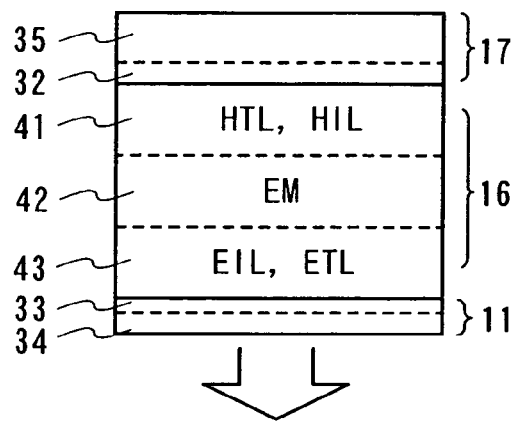
Figure 16D:
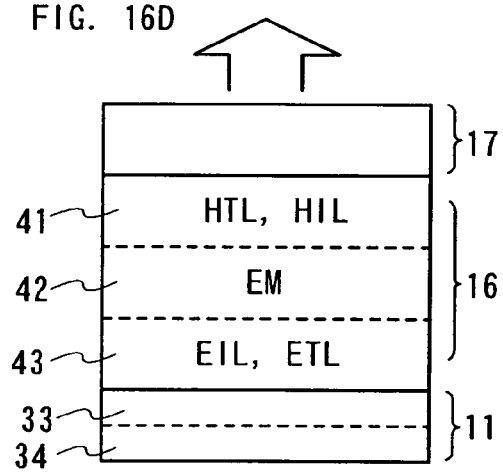
Figure 16E:
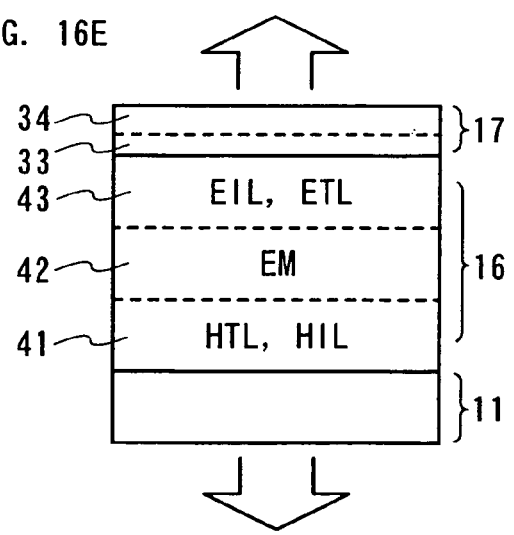

FIG. 16E illustrates an example in which light is emitted in both directions, namely from a first electrode side and a second electrode side. The first pixel electrode 11 is formed of a light-transmitting conductive film having a high work function while the second pixel electrode 17 is formed of a light-transmitting conductive film having a low work function. Typically, the first pixel electrode 11 may be formed of a conductive oxide material containing silicon oxide at a concentration of 1 to 15 atomic % while the second pixel electrode 17 may be formed to have the third electrode layer 33 containing an alkaline metal or an alkaline earth metal such as LiF and CaF, and the fourth electrode layer 34 containing a metal material such as aluminum, each of which is not thicker than 100 nm.

FIG. 16C illustrates an example in which light is emitted from the first pixel electrode 11 side, and the layer 16 containing a light-emitting substance has stacked layers of a layer 43 including at least an electron-injecting layer (EIL) and an electron-transporting layer (ETL), a light-emitting layer 42 and a layer 41 including at least a hole-transporting layer (HTL) and a hole-injecting layer (HIL) in this order. In the case of the layer 41 and the layer 43 including both the HTL and the HIL, and both the EIL and the ETL respectively, the HIL and the ETL is preferably formed over the HTL and the EIL respectively. Over the layer 16 containing a light-emitting substance, the second pixel electrode 17 is formed, which has stacked layers of the second electrode layer 32 formed of a conducive oxide material containing silicon oxide at a concentration of 1 to 15 atomic %, and the first electrode layer 35 formed of a metal such as aluminum and titanium or a metal material containing such metal and nitrogen at a concentration of not higher than the stoichiometric composition ratio. The first pixel electrode 11 has stacked layers of the third electrode layer 33 containing an alkaline metal or an alkaline earth metal such as LiF and CaF, and the fourth electrode layer 34 formed of a metal material such as aluminum. By forming each layer not to be thicker than 100 nm to transmit light, light can be emitted from the first pixel electrode 11 side.

FIG. 16D illustrates an example in which light is emitted from the second pixel electrode 17 side, and the layer 16 containing a light-emitting substance has stacked layers of a layer 43 including at least an electron-injecting layer (EIL) and an electron-transporting layer (ETL), a light-emitting layer 42 and a layer 41 including at least a hole-transporting layer (HTL) and a hole-injecting layer (HIL) in this order. In the case of the layer 41 and the layer 43 including both the HTL and the HIL, and both the EIL and the ETL respectively, the HIL and the ETL is preferably formed over the HTL and the EIL respectively. The first electrode 11 has a structure similar to the second pixel electrode in FIG. 16A, and is formed thick enough to reflect light which is emitted from the layer containing a light-emitting substance. The second pixel electrode 17 is formed of a conductive oxide material containing silicon oxide at a concentration of 1 to 15 atomic %. In such a structure, when at least one of the hole-transporting layer and the hole-injecting layer is formed of a metal oxide as an inorganic substance (typically, molybdenum oxide or vanadium oxide), oxygen which is introduced during the formation of the second electrode layer 17 is supplied and thus the hole-injecting property can be improved; thus a drive voltage can be decreased.

Figure 16F:
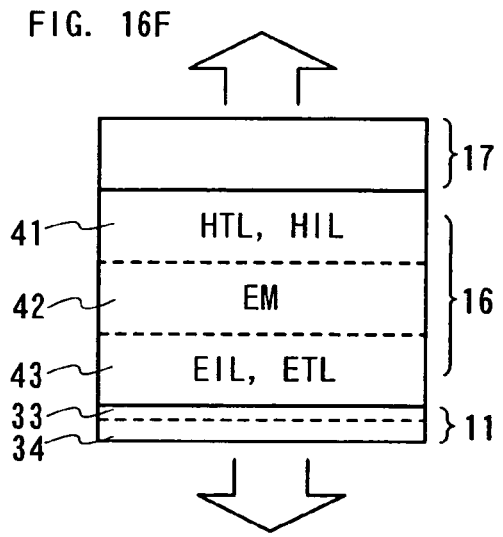

FIG. 16F illustrates an example in which light is emitted from both directions, namely from the first pixel electrode side and the second pixel electrode side. The first pixel electrode 11 is formed of a light-transmitting conductive film having a low work function while the second pixel electrode 17 is formed of a light-transmitting conductive film having a high work function. Typically, the first pixel electrode 11 may be formed to have the third electrode layer 33 containing an alkaline metal or an alkaline earth metal such as LiF and CaF, and the fourth electrode layer 34 formed of a metal material such as aluminum, each of which is not thicker than 100 nm, while the second pixel electrode 17 may be formed of a conductive oxide material containing silicon oxide at a concentration of 1 to 15 atomic %.

Embodiment 5

A pixel circuit of the light-emitting display panel and the operation structure thereof shown in the aforementioned embodiments are described with reference to FIGS. 17A to 17F. As an operation structure of the light-emitting display panel for a display device having an input of a digital video signal, there is the one in which a voltage is inputted as a video signal to a pixel and the one in which a current is inputted as a video signal to a pixel. The display device having a video signal input of a voltage includes the one in which a voltage applied to a light-emitting element is constant (CVCV) and the one in which a current applied to a light-emitting element is constant (CVCC). In addition, the display device having a video signal input of a current includes the one in which a constant voltage is applied to a light-emitting element (CCCV) and the one in which a constant current is applied to a light-emitting element (CCCC). In this embodiment, the pixels which perform the CVCV operation are described with reference to FIGS. 17A and 17B. In addition, the pixels which performs the CVCC operation are described with reference to FIGS. 17C to 17F.

Figure 17A:
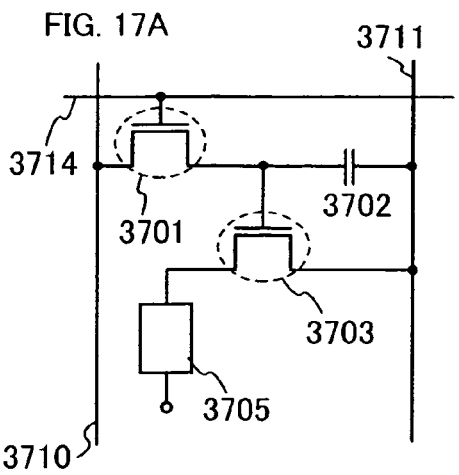
FIGS. 17A to 17F are diagrams showing circuits of light emitting elements which can be applied to the present invention.
Figure 17B:
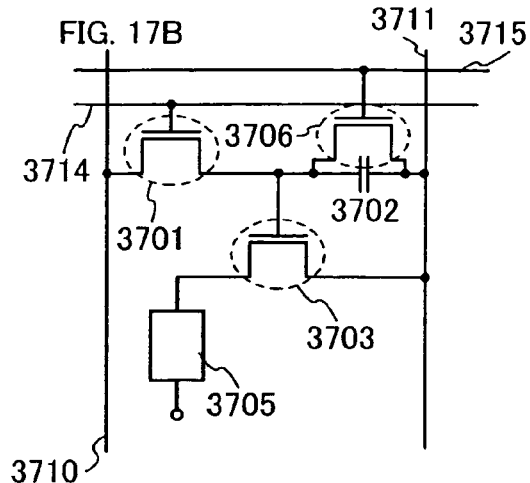

In the pixels shown in FIGS. 17A and 17B, a source line 3710 and a power supply line 3711 are disposed in columns, and a gate line 3714 is disposed in rows. In addition, the pixel includes a switching TFT 3701, a driving TFT 3703, a capacitor element 3702 and a light-emitting element 3705.

Note that the switching TFT 3701 and the driving TFT 3703 operate in the linear region when they are ON. The driving TFT 3703 functions to control whether or not to apply a voltage to the light-emitting element 3705. Both the TFTs preferably have the same conductivity in view of the manufacturing steps, and in this embodiment, p-channel TFTs are employed as the TFTs. In addition, the driving TFT 3703 may be either an enhancement mode TFT or a depletion mode TFT. The ratio of the channel width W to the channel length L (W/L) of the driving TFT 3703 is preferably 1 to 1000, though it depends on the mobility of the TFT. As the W/L is larger, the electric property of the TFT can be further improved.

In the pixels shown in FIGS. 17A and 17B, the switching TFT 3701 controls a video signal input to each pixel. When the switching TFT 3701 is turned ON, a video signal is inputted to the pixel. Then, a voltage of the video signal is held in the capacitor element 3702.

In FIG. 17A, when the power supply line 3711 is at Vss while a counter electrode of the light-emitting element 3705 is at Vdd, namely in the cases of FIGS. 16C and 16D, the counter electrode of the light-emitting element is an anode while an electrode thereof connected to the driving TFT 3703 is a cathode. In this case, luminance unevenness caused by the characteristic variations of the driving TFT 3703 can be suppressed.

In FIG. 17A, when the power supply line 3711 is at Vdd while the counter electrode of the light-emitting element 3705 is at Vss, namely in the case of FIGS. 16A and 16B, the counter electrode of the light-emitting element is a cathode while the electrode thereof connected to the driving TFT 3703 is an anode. In this case, by inputting a video signal having a voltage higher than Vdd to the source line 3710, the voltage of the video signal is held in the capacitor element 3702, and the driving TFT 3703 operates in the linear region. Therefore, luminance unevenness caused by the variations of TFTs can be improved.

The pixels shown in FIG. 17B has basically the same pixel configuration as FIG. 17A except that a TFT 3706 and a gate line 3715 are additionally provided.

ON/OFF of the TFT 3706 is controlled by the gate line 3715 which is additionally provided. When the TFT 3706 is turned ON, charges held in the capacitor element 3702 are discharged; thereby the driving TFT 3703 is turned OFF. That is, the provision of the TFT 3706 can forcibly provide the state where no current flows to the light-emitting element 3705. Therefore, the TFT 3706 can be referred to as an erasing TFT. Thus, in the configuration in FIG. 17B, the emission period can start simultaneously with or immediately after the writing period without awaiting the signal input to the whole pixels. Therefore, the duty ratio of emission can be improved.

In the pixel having the aforementioned configurations, the current value of the light-emitting element 3705 can be determined by the driving TFT 3703 which operates in the linear region. According to the aforementioned configurations, the variations in characteristics of TFTs can be suppressed, and luminance unevenness of light-emitting elements due to the variations in characteristics of TFTs can be improved, thereby a display device with improved image quality can be provided.

The pixel which performs CVCC operation is described with reference to FIGS. 17C to 17F. The pixel shown in FIG. 17C corresponds to the pixel configuration shown in FIG. 17A additionally provided with a power supply line 3712 and a current-controlling TFT 3704.

Figure 17C:
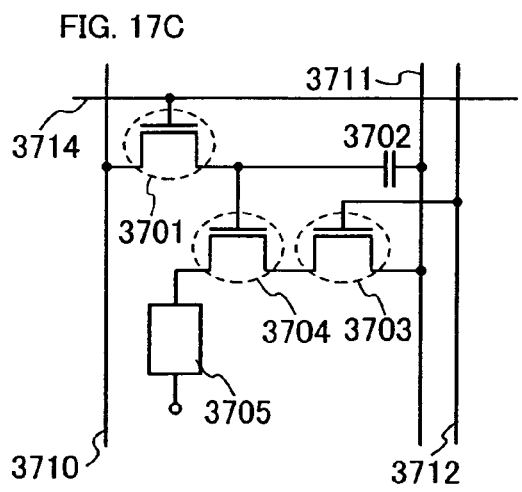
Figure 17D:
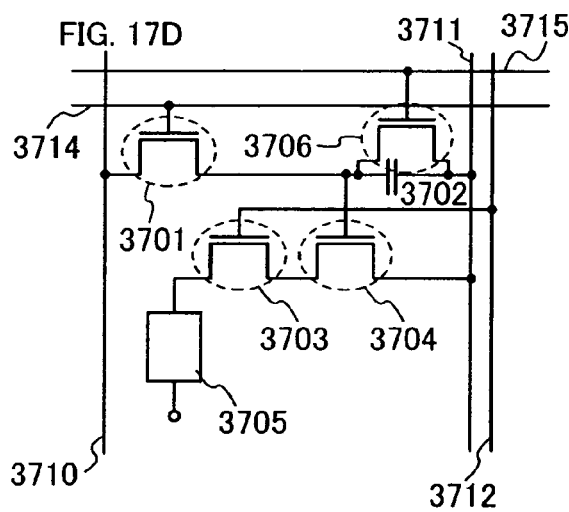
Figure 17E:
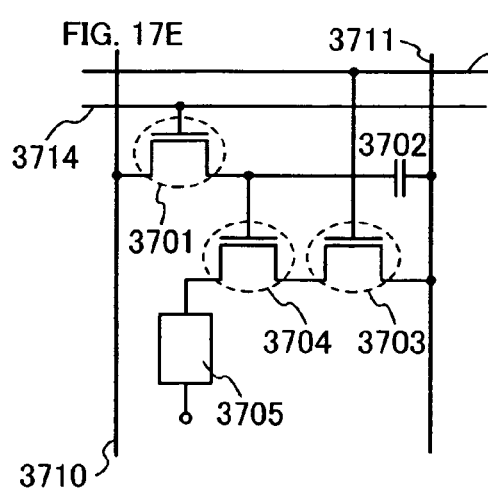

The pixel shown in FIG. 17E has basically the same pixel configuration as FIG. 17C except that the gate electrode of the driving TFT 3703 is connected to the power supply line 3712 disposed in rows. That is, the pixels shown in FIGS. 17C and 17E are equivalent circuit diagrams of similar circuits. However, the power supply line 3712 is formed of a conductive film in the different layer in the case where the power supply line 3712 is disposed in columns (FIG. 17C) and the case where the power supply line 3712 is disposed in rows (FIG. 17E). Here, a wiring connected to the gate electrode of the driving TFT 3703 is considered, and the description is made separately in FIGS. 17C and 17E in order to show that the respective wirings are manufactured in different layers.

Note that the switching TFT 3701 operates in the linear region while the driving TFT 3703 operates in the saturation region. In addition, the driving TFT 3703 functions to control the values of current flowing to the light-emitting element 3705 while the current-controlling TFT 3704 operates in the saturation region and functions to control the current supplied to the light-emitting element 3705.

Figure 17F:
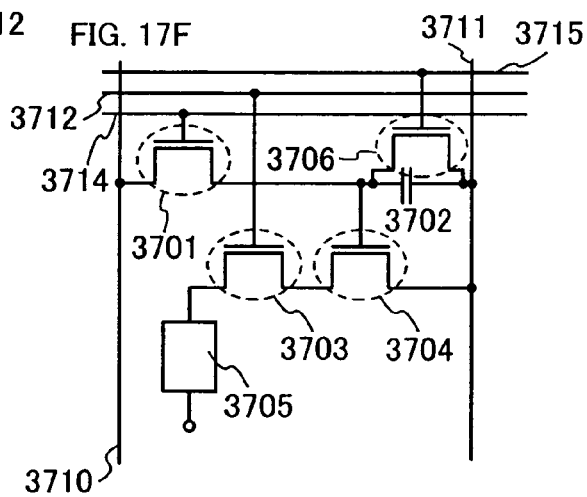

The pixels shown in FIGS. 17D and 17F have basically the same configurations as the pixels shown in FIGS. 17C and 17E respectively except that an erasing TFT 3706 and a gate line 3715 are additionally provided.

Note that the pixels shown in FIGS. 17A and 17B can also perform CVCC operation. In addition, in the pixels having the operation structures shown in FIGS. 17C to 17F, Vdd and Vss can be appropriately changed according to the flowing direction of the current of the light-emitting element similarly to FIGS. 17A and 17B.

In the pixels having the aforementioned configurations, the current-controlling TFT 3704 operates in the linear region; therefore, slight fluctuation of Vgs of the current-controlling TFT 3704 does not affect the current value of the light-emitting element 3705. That is, the current value of the light-emitting element 3705 can be determined by the driving TFT 3703 which operates in the saturation region. According to the aforementioned configurations, luminance unevenness of light-emitting elements due to the variations in characteristics of TFTs can be improved, thereby a display device with improved image quality can be provided.

In particular, in the case of forming a thin film transistor having an amorphous semiconductor or the like, the area of a semiconductor film of a driving TFT is preferably large as the variations of TFTs can be reduced. Therefore, the pixels shown in FIGS. 17A and 17B can have a higher aperture ratio as they have a small number of TFTs.

Note that the examples show the configurations provided with the capacitor element 3702; however, the present invention is not limited to this, and the capacitor element 3702 may be omitted if the gate capacitor or the like can serve as the capacitor for holding video signals.

Note that in the case where the semiconductor region of a thin film transistor is formed of an amorphous semiconductor film, the threshold voltage shifts easily; therefore, a circuit for correcting the threshold voltage is preferably provided inside or on the periphery of a pixel.

Such an active matrix light-emitting device is considered to be advantageous when the pixel density is increased, since TFTs are provided in each pixel and a low voltage drive can thus be achieved. On the other hand, a passive matrix light-emitting device in which TFTs are provided in each column can be formed as well. The passive matrix light-emitting device has no TFT in each pixel; therefore, it has high aperture ratio.

In such a light-emitting device of the present invention, a driving method for image display is not specifically limited. For example, a dot-sequential driving method, a line-sequential driving method, a plane-sequential driving method or the like may be employed. Typically, the line-sequential driving method is employed, and a time-division gray scale driving method or an area gray scale driving method may be appropriately used. In addition, a video signal inputted to a source line of the display device may be an analog signal or a digital signal. A driving circuit or the like may be appropriately designed in accordance with the video signal.

As described above, various types of pixel circuits can be adopted.

Embodiment 6

In this embodiment, the exterior view of a light-emitting display panel as an example of a display panel is described with reference to FIGS. 18A and 18B. FIG. 18A is a top view of a panel which is obtained by sealing between a first substrate and a second substrate with a first sealant 1205 and a second sealant 1206. FIG. 18B is a cross-sectional diagram thereof corresponding to a line A-A' in FIG. 18A.

In FIG. 18A, reference numeral 1201 indicated by dotted lines is a source line driver circuit, 1202 is a pixel portion and 1203 is a gate line driver circuit. In this embodiment, the source line driver circuit 1201, the pixel portion 1202 and the gate line driver circuit 1203 are located in the region sealed with the first sealant and the second sealant. The first sealant is preferably an epoxy resin having high viscosity including a filler. On the other hand, the second sealant is preferably an epoxy resin having low viscosity. In addition, the first sealant 1205 and the second sealant 1206 are desirably materials which do not transmit moisture or oxygen.

In addition, a drying agent may be provided between the pixel portion 1202 and the first sealant 1205. Further, a drying agent may be provided over the gate line or the source line. The drying agent is preferably a substance which absorbs water ($H_2O$) by chemical absorption such as the oxide of alkaline earth metals such as calcium oxide (CaO), barium oxide (BaO). However, the present invention is not limited to these, and a substance which absorbs water by physical absorption such as zeolite and silica gel may be used as well.

By providing the drying agent in the region overlapping the gate line or the source line, or fixing a resin having high moisture permeability on the second substrate 1204 in the condition of containing a particulate drying agent, intrusion of moisture into a display element and degradation resulting therefrom can be suppressed without decreasing the aperture ratio.

Here, as the resin having high moisture permeability, an organic substance or an inorganic substance such as an acrylic resin, an epoxy rein, siloxane polymers, polyimide, PSG (Phosphor Silicate Glass) and BPSG (Boron Phosphorus Silicon Glass) can be used.

Note that reference numeral 1210 denotes a connecting wiring for transmitting signals inputted to the source line driver circuit 1201 and the gate line driver circuit 1203, which receives video signals or clock signals from an FPC (Flexible Printed Circuit) 1209, which is an external input terminal through a connecting wiring 1208.

Next, the cross-sectional structure is described with reference to FIG. 18B. Over a first substrate 1200, a driver circuit and a pixel portion are formed, which include a plurality of semiconductor elements typified by TFTs. The source line driver circuit 1201 as a driver circuit and the pixel portion 1202 are shown here. Note that the source line driver circuit 1201 is constituted by a CMOS circuit including an n-channel TFT 1221 and a p-channel TFT 1222.

In this embodiment, TFTs of the source line driver circuit, the gate line driver circuit and the pixel portion are formed over the same substrate. Therefore, the volume of the light-emitting display panel can be reduced.

The pixel portion 1202 includes a plurality of pixels, each of which includes a switching TFT 1211, a driving TFT 1212 and a first pixel electrode (anode) 1213 formed of a reflective conductive film which is electrically connected to the drain of the driving TFT 1212.

As an interlayer insulating film 1220 of such TFTs 1211, 1212, 1221 and 1222, an inorganic material (e.g., silicon oxide, silicon nitride or silicon oxynitride), an organic material (e.g., polyimide, polyamide, polyimide amide or benzocyclobutene) or a material containing siloxane polymers as a main component can be used.

In addition, an insulator (also referred to as a bank, partition wall, barrier, mound or the like) 1214 is formed on opposite ends of the first pixel electrode (anode) 1213. In order to increase the coverage of a film formed over the insulator 1214, the insulator 1214 is formed to have a curved surface having curvature on the top end or the bottom end.

Over the first pixel electrode (anode) 1213, an organic compound material is deposited to selectively form a layer 1215 containing a light-emitting substance. In addition, a second pixel electrode 1216 is formed over the layer 1215 containing a light-emitting substance.

The layer 1215 containing a light-emitting substance can appropriately adopt the structure shown in Embodiment 4.

In this manner, a light-emitting element 1217 including the first pixel electrode (anode) 1213, the layer 1215 containing a light-emitting substance and the second pixel electrode (cathode) 1216 is formed. The light-emitting element 1217 emits light to the second substrate 1204 side.

In addition, a protective stacked layer 1218 is formed in order to seal the light-emitting element 1217. The protective stacked layer 1218 has stacked layers of a first inorganic insulating film, a stress relaxation film and a second inorganic insulating film. Then, the protective stacked layer 1218 adheres to the second substrate 1204 with the first sealant 1205 and the second sealant 1206. Note that the second sealant is preferably dropped using a system for discharging a composition. After dropping or discharging the sealant from a dispenser to be applied on the active matrix substrate, the second substrate adheres to the active matrix substrate in vacuum condition, and ultraviolet curing is performed; therefore they can be sealed.

The connecting wiring 1208 and the FPC 1209 are electrically connected with an anisotropic conductive film or an anisotropic conductive resin 1227. Further, it is preferable that a connecting portion of each wiring layer and the connecting terminal be sealed with a sealing resin. With such a structure, it can be prevented that the moisture enters the light-emitting element from the cross-sectional portion and that it causes the degradation.

Note that the space between the second substrate 1204 and the protective stacked layer 1218 may be filled with an inert gas, for example, a nitrogen gas. The prevention of the intrusion of moisture and oxygen can be enhanced.

In addition, the second substrate 1204 may be provided with a colored layer. In this case, full color display can be performed by providing light-emitting elements capable of white emission in the pixel portion and additionally providing colored layers of RGB. Alternatively, full color display can be performed by providing light-emitting elements capable of blue emission in the pixel portion and additionally providing a color conversion layer or the like. Further, a light-emitting element which emits red, green or blue light may be formed in each pixel and the colored layer may be used in combination as well. Such a display module has high color purity of each RGB, and thus is capable of displaying high-resolution images.

In addition, the surface of the second substrate 1204 may be provided with a polarizing plate and a retardation plate.

In addition, one or both of the first substrate 1200 and the second substrate 1204 may be formed using a film, a resin substrate or the like to form a light-emitting display panel. By sealing without using a counter substrate in such a manner, weight saving, downsizing and slimming of the display device can be achieved.

Further, by connecting an external circuit such as a power supply circuit and a controller to the light-emitting display panel, a light-emitting display module can be formed.

Note that any of Embodiment Modes 1 to 8 can be applied to this embodiment.

Examples of a liquid crystal display panel and a light-emitting display panel as a display panel, and examples of a liquid crystal display module and a light-emitting display module as a display module are described; however, the present invention is not limited to these. For example, the present invention can be appropriately applied to a display panel or a display module of a DMD (Digital Micromirror Device), PDP (Plasma Display Panel), FED (Field Emission Display) and electrophoretic display device (electronic paper) or the like.

Embodiment 7

In this embodiment, the mounting of a driver circuit on the display panel shown in the aforementioned embodiments is described with reference to FIGS. 19A to 19C.

Figure 19A:
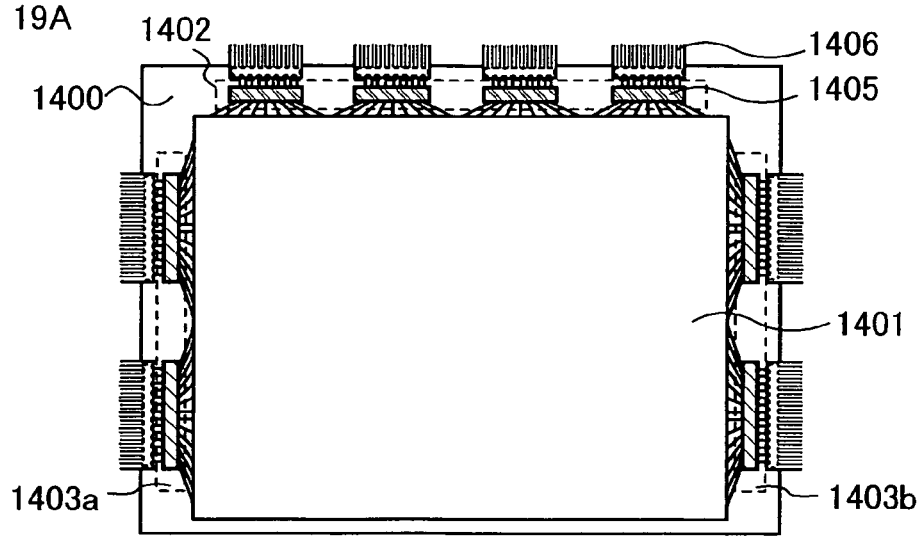
FIGS. 19A to 19C are top views showing methods for mounting a driving circuit of a display device according to the present invention.

As shown in FIG. 19A, a source line driver circuit 1402 and gate line driver circuits 1403a and 1403b are mounted on the periphery of a pixel portion 1401. In FIG. 19A, IC chips 1405 are mounted on a substrate 1400 as the source line driver circuit 1402, the gate line driver circuits 1403a and 1403b and the like by a known mounting method using an anisotropic conductive adhesive and an anisotropic conductive film, COG bonding, wire bonding, reflow processing using a solder bump or the like. Here, COG bonding is employed to connect the IC chips to an external circuit by an FPC (Flexible Printed Circuit) 1406.

Note that a part of the source line driver circuit 1402, for example, an analog switch may be formed on the substrate 1400 while the other part thereof may be mounted with an IC chip separately.

Figure 19B:
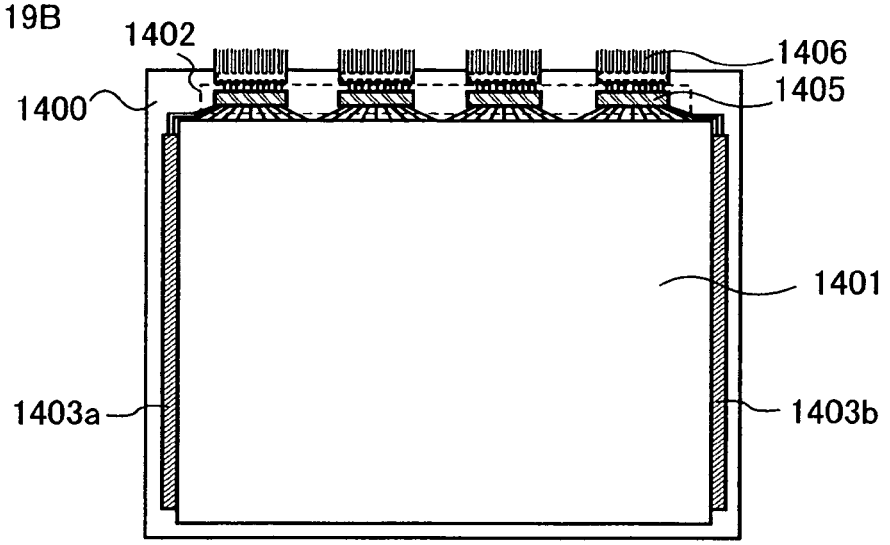

In addition, in the case of forming a TFT using an SAS or a crystalline semiconductor as shown in FIG. 19B, there is a case where the pixel portion 1401, the gate line driver circuits 1403a and 1403b and the like are formed over the substrate 1400 while the source line driver circuit 1402 and the like are mounted as IC chips separately. In FIG. 19B, the IC chip 1405 is mounted as the source line driver circuit 1402 on the substrate 1400 by COG bonding. Then, the IC chip is connected to an external circuit by the FPC 1406.

Note that a part of the source line driver circuit 1402, for example an analog switch may be formed on the substrate 1400 while the other part thereof may be mounted with an IC chip separately.

Figure 19C:
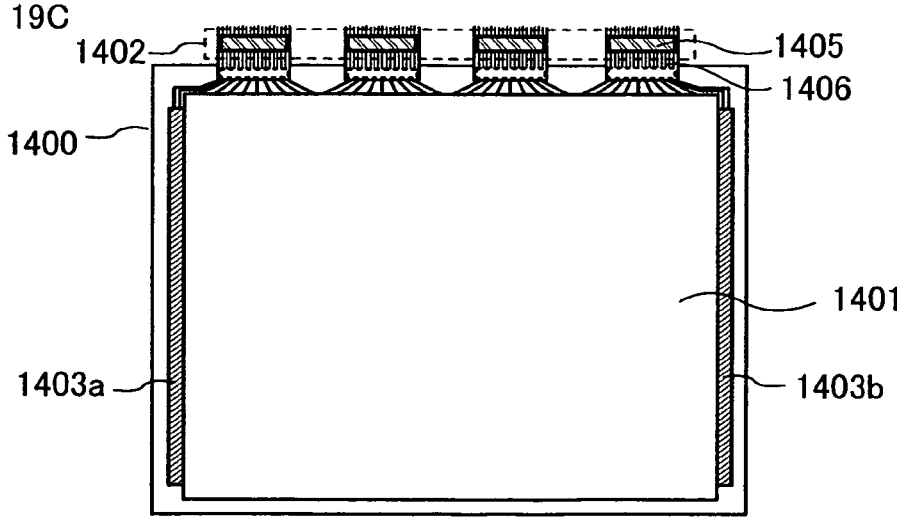

Further, as shown in FIG. 19C, there is a case where the source line driver circuit 1402 or the like is mounted by TAB instead of COG bonding. Then, the IC chip and an external circuit are connected through the FPC 1406. In FIG. 19C, the source line driver circuit is mounted by TAB; however, the gate line driver circuit may be mounted by TAB.

By mounting an IC chip by TAB, a pixel portion can be provided in a large area relatively to a substrate, thereby downsizing of a frame can be achieved.

An IC chip is formed using a silicon wafer; however, an IC obtained by forming a circuit over a glass substrate (hereinafter referred to as a driver IC) may be provided instead of the IC chip. The IC chip is taken from a circular silicon wafer; therefore, it has a restriction in the shape of a mother substrate. On the other hand, the driver IC is formed using glass as a mother substrate, and thus has no restriction in the shape; therefore, productivity can be increased. Thus, the shape and the size of the driver IC can be set freely. For example, when driver ICs are each formed to have a long side of 15 to 80 mm, a smaller number of driver ICs is required as compared to the case of mounting IC chips. As a result, the number of connecting terminals can be reduced, thereby the yield in manufacture can be improved.

The driver IC can be formed using a crystalline semiconductor formed over a substrate. The crystalline semiconductor is preferably formed by irradiation with continuous wave laser light. A semiconductor film obtained by irradiation of continuous wave laser light has few crystal defects and has crystal grains with large grain size. As a result, a transistor having such a semiconductor film has excellent mobility and response speed and can be driven at high speed. Thus, it is suitable for a driver IC.

Embodiment 8

Figure 20A:
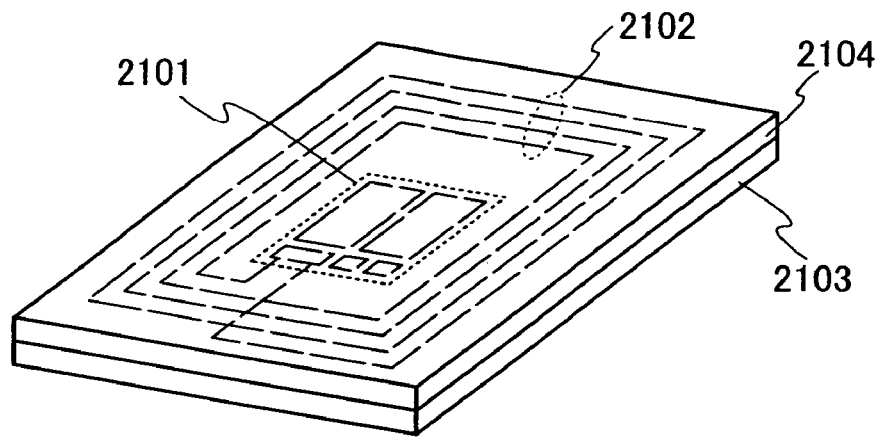
FIGS. 20A and 20B are perspective views showing an example of a semiconductor device according to the present invention.

FIG. 20A is a perspective view illustrating one mode of an ID chip which is one aspect of the present invention. Reference numeral 2101 denotes an integrated circuit and 2102 denotes an antenna. The antenna 2102 is connected to the integrated circuit 2101. Reference numeral 2103 denotes a substrate and 2104 denotes a covering material. The integrated circuit 2101 and the antenna 2102 are formed over the substrate 2103, and the covering material 2104 overlaps the substrate 2103 so as to cover the integrated circuit 2101 and the antenna 2102. Note that the covering material 2104 is not necessarily required; however, when the integrated circuit 2101 and the antenna 2102 are covered with the covering material 2104, the mechanical strength of the ID chip can be increased. Alternatively, the integrated circuit may be covered with the antenna. That is, the area occupied by the integrated circuit may be equal to the area occupied by the antenna.

By forming the integrated circuit 2101 using the semiconductor element shown in the aforementioned embodiment modes or embodiments, an ID chip having few variations can be manufactured with high yield.

Figure 20B:
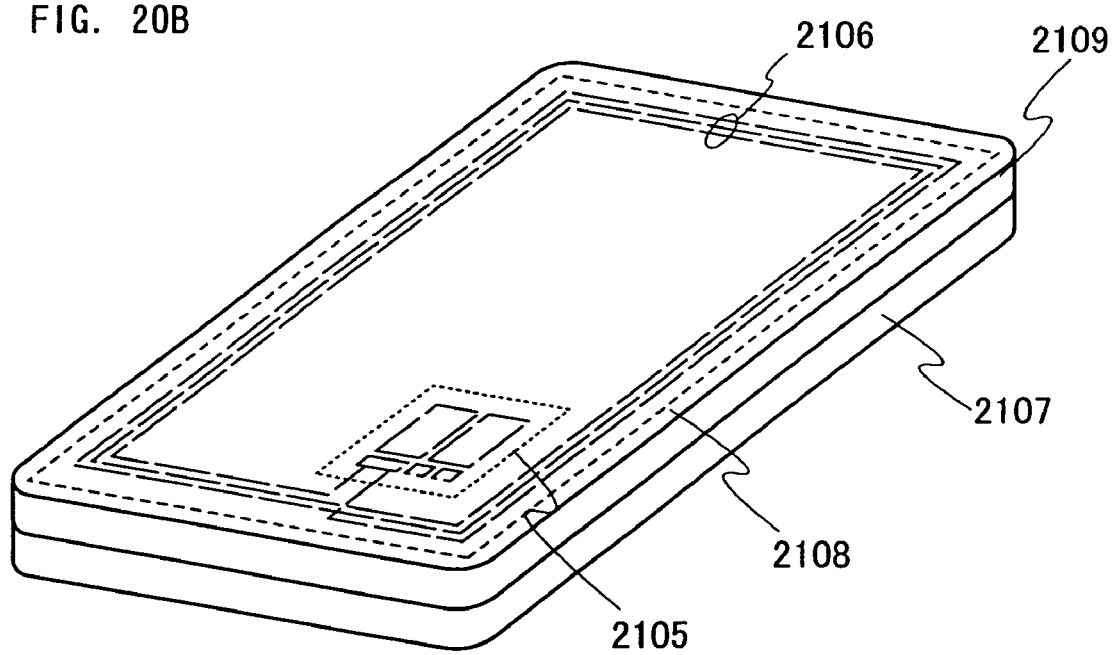

FIG. 20B is a perspective view illustrating one mode of an IC card which is one aspect of the present invention. Reference numeral 2105 denotes an integrated circuit and 2106 denotes an antenna. The antenna 2106 is connected to the integrated circuit 2105. Reference numeral 2108 denotes a substrate serving as an inlet sheet, and 2107 and 2109 denote covering materials. The integrated circuit 2105 and the antenna 2106 are formed over the inlet sheet 2108, and the inlet sheet 2108 is interposed between the two covering materials 2107 and 2109. Note that the IC card of the present invention may have a display device connected to the integrated circuit 2105.

By forming the integrated circuit 2105 using the semiconductor element shown in the aforementioned embodiment modes or embodiments, an IC card having few variations can be manufactured with high yield.

Embodiment 9

Figure 21:
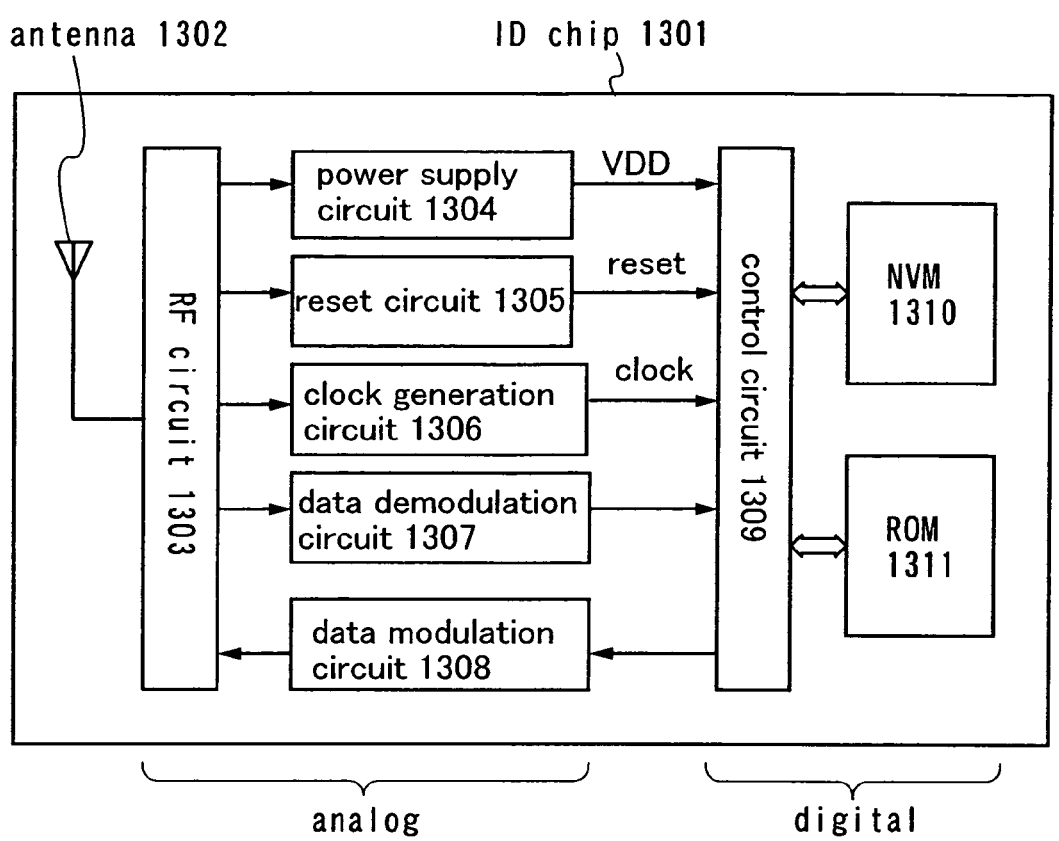
FIG. 21 is a block diagram showing an example of a semiconductor device according to the present invention.

FIG. 21 is a typical block diagram of an ID chip typified by a contactless RFID (Radio Frequency Identification) tag, wireless tag and the like according to one aspect of the present invention. FIG. 21 shows a configuration having an easy function for reading out fixed data such as authentication data. In FIG. 21, an ID chip 1301 includes an antenna 1302, an RF circuit 1303, a power supply circuit 1304, a reset circuit 1305, a clock generation circuit 1306, a data demodulation circuit 1307, a data modulation circuit 1308, a control circuit 1309, a nonvolatile memory (referred to as NVM) 1310 and an ROM 1311.

In this embodiment, the semiconductor element shown in the aforementioned embodiment modes or embodiments can be used for any of the power supply circuit 1304, the reset circuit 1305, the clock generation circuit 1306, the data demodulation circuit 1307, the data modulation circuit 1308 and the control circuit 1309. Accordingly, an ID chip can be manufactured efficiently.

In addition, the circuits shown in FIG. 21 all are formed over a glass substrate, a flexible substrate or a semiconductor substrate. The antenna 1302 may be formed either over the glass substrate, the flexible substrate or the semiconductor substrate, or may be formed outside the substrate and connected to the semiconductor integrated circuit inside the substrate.

The RF circuit 1303 receives analog signals from the antenna 1302, and outputs analog signals from the antenna 1302 received from the data modulation circuit 1308. The power supply circuit 1304 generates a constant power supply from received signals, the reset circuit 1305 generates reset signals, the clock generation circuit 1306 generates clock signals, the data demodulation circuit 1307 extracts data from received signals, and the data modulation circuit 1308 generates analog signals to be outputted to the antenna based on the received digital signals from the control circuit, or changes the characteristics of the antenna. Such circuits are included in the analog portion.

Meanwhile, the control circuit 1309 receives data extracted from the received signals, and reads out the data. Specifically, the control circuit 1309 generates address signals of the NVM 1310 or the ROM 1311, reads out data, and transmits the readout data to the data modulation circuit 1308. Such circuits are included in the digital portion.

Embodiment 10

As electronic devices having the semiconductor device shown in embodiment modes and embodiments, there are a television set (also simply referred to as a television or a television receiver set), a camera such as digital camera or digital video camera, a portable phone set (also simply referred to as a portable phone), a portable information terminal such as a PDA, a portable game machine, a computer monitor, a computer, an audio reproducing system such as a car audio system, an image reproducing system provided with a recording medium such as a home game machine, and the like. Specific examples of such electronic devices are described with reference to FIGS. 23A to 23F.

Figure 23A:
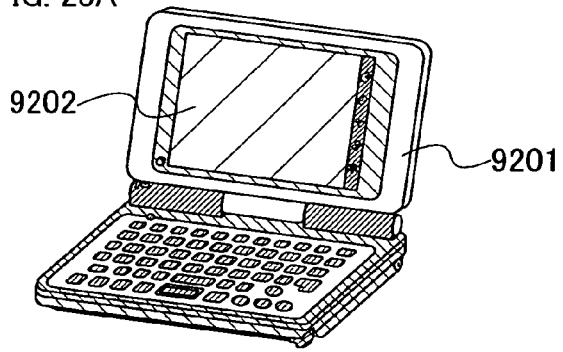
FIGS. 23A to 23F are diagrams showing examples of electronic devices.

A portable information terminal shown in FIG. 23A includes a main body 9201, a display portion 9202 and the like. The display portion 9202 can be formed by adopting the semiconductor device shown in Embodiment Modes 1 to 7 or Embodiments 1 to 9. By using the display device as one aspect of the present invention, a portable information terminal capable of displaying high-quality images can be provided at low cost.

Figure 23B:
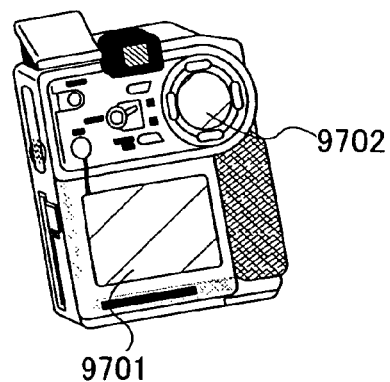

A digital video camera shown in FIG. 23B includes a display portion 9701, a sub-display portion 9702 and the like. The display portion 9701 can be formed by adopting the semiconductor device shown in Embodiment Modes 1 to 7 or Embodiments 1 to 9. By using the display device as one aspect of the present invention, a digital video camera capable of displaying high-quality images can be provided at low cost.

Figure 23C:
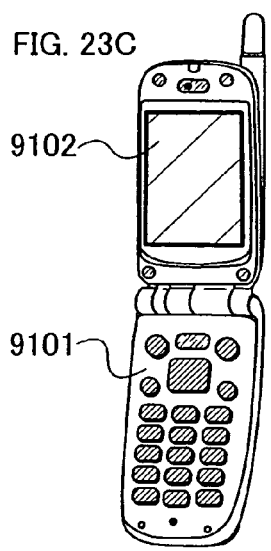

A portable terminal shown in FIG. 23C includes a main body 9101, a display portion 9102 and the like. The display portion 9102 can be formed by adopting the semiconductor device shown in Embodiment Modes 1 to 7 or Embodiments 1 to 9. By using the display device as one aspect of the present invention, a portable terminal capable of displaying high-quality images can be provided at low cost.

Figure 23E:
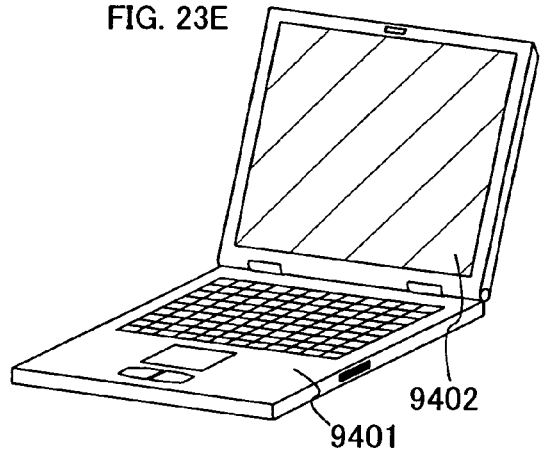
Figure 23D:
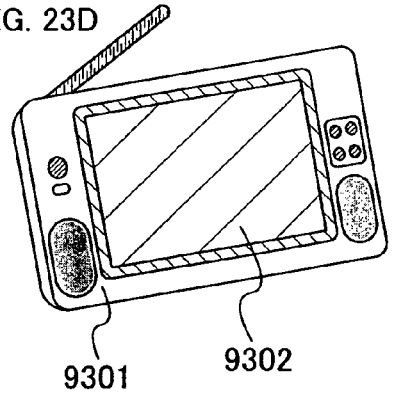

A portable television set shown in FIG. 23D includes a main body 9301, a display portion 9302 and the like. The display portion 9302 can be formed by adopting the semiconductor device shown in Embodiment Modes 1 to 7 or Embodiments 1 to 9. By using the display device as one aspect of the present invention, a portable television set capable of displaying high-quality images can be provided at low cost. Such a television set has a wide range of applications including a compact-size television set mounted on a portable terminal such as a portable phone, a medium-size portable television set and a large-size television set (e.g., 40 inches or more).

A portable computer shown in FIG. 23E includes a main body 9401, a display portion 9402 and the like. The display portion 9402 can be formed by adopting the semiconductor device shown in Embodiment Modes 1 to 7 or Embodiments 1 to 9. By using the display device as one aspect of the present invention, a portable computer capable of displaying high-quality images can be provided at low cost.

Figure 23F:
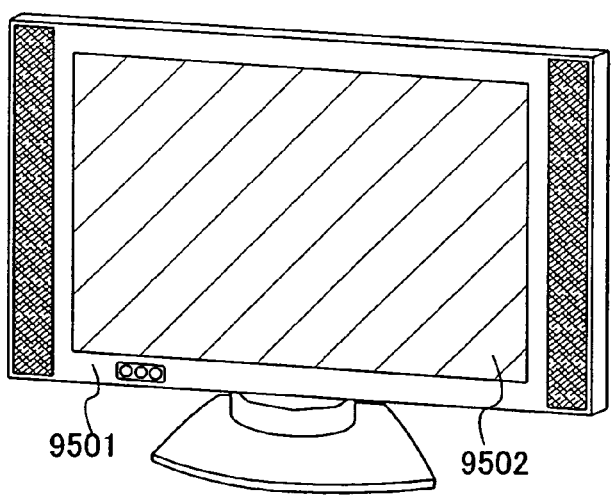

A television set shown in FIG. 23F includes a main body 9501, a display portion 9502 and the like. The display portion 9502 can be formed by adopting the semiconductor device shown in Embodiment Modes 1 to 7 or Embodiments 1 to 9. By using the display device as one aspect of the present invention, a television set capable of displaying high-quality images can be provided at low cost.

Among the aforementioned electronic devices, those using a secondary battery can operate for a longer period by the reduced amount of power consumption, and the secondary battery is not required to be charged.

What is claimed is:

1. A method for manufacturing a semiconductor device, comprising the steps of:
   forming a conductive layer over a substrate;
   forming an insulating layer over the conductive layer;
   forming a semiconductor film over the insulating layer;

forming an oxide layer over a part of the semiconductor film; and patterning the semiconductor film by an etching method using the oxide layer as a mask, wherein the oxide layer is formed by soaking the semiconductor film in an oxidizing agent with a protective material covering a portion of the semiconductor film which is not to be oxidized.

2. The method for manufacturing a semiconductor device according to claim 1, wherein the patterned semiconductor film is amorphous.

3. The method for manufacturing a semiconductor device according to claim 1, wherein the patterned semiconductor film is crystalline.

4. The method for manufacturing a semiconductor device according to claim 1, wherein a method for etching a part of the semiconductor film is wet etching.

5. The method for manufacturing a semiconductor device according to claim 1, wherein a method for etching a part of the semiconductor film is dry etching.

6. The method for manufacturing a semiconductor device according to claim 1, wherein said semiconductor film is etched to form an active layer of a thin film transistor.

7. A method for manufacturing a semiconductor device, comprising the steps of:

forming a semiconductor film over a substrate;

forming a second oxide layer over a part of a first oxide layer formed on the semiconductor film;

removing an exposed portion of the first oxide layer; and patterning the semiconductor film by etching using the second oxide layer as a mask.

8. The method for manufacturing a semiconductor device according to claim 7, wherein the second oxide layer is formed by soaking the first oxide layer and the semiconductor film in an oxidizing agent with a protective material covering a portion of the first oxide layer and a portion of the semiconductor film which are not to be oxidized.

9. The method for manufacturing a semiconductor device according to claim 7, wherein the patterned semiconductor film is amorphous.

10. The method for manufacturing a semiconductor device according to claim 7, wherein the patterned semiconductor film is crystalline.

11. The method for manufacturing a semiconductor device according to claim 7, wherein a method for etching a part of the semiconductor film is wet etching.

12. The method for manufacturing a semiconductor device according to claim 7, wherein a method for etching a part of the semiconductor film is dry etching.

13. The method for manufacturing a semiconductor device according to claim 7, wherein said semiconductor film is etched to form an active layer of a thin film transistor.

14. The method for manufacturing a semiconductor device according to claim 7, wherein the second oxide layer is formed by irradiating the first oxide layer and the semiconductor film with laser light through a mask having a light-transmitting portion and a light-shielding portion.

15. The method for manufacturing a semiconductor device according to claim 14, wherein a beam spot on an irradiated surface of the laser light is any one of linear shape, rectangular shape and planar shape.

16. The method for manufacturing a semiconductor device according to claim 14, wherein the laser light is continuous wave laser light.

17. The method for manufacturing a semiconductor device according to claim 14, wherein the laser tight is pulsed laser light.

18. A method for manufacturing a semiconductor device, comprising the steps of:

forming a semiconductor film over a substrate;

removing a first oxide layer formed on the semiconductor film;

forming a second oxide layer over a part of the semiconductor film; and patterning the semiconductor film by etching using the second oxide layer as a mask, wherein the second oxide layer is formed by irradiating the semiconductor film with laser light through a mask having a light-transmitting portion and a light-shielding portion.

19. The method for manufacturing a semiconductor device according to claim 18, wherein a beam spot on an irradiated surface of the laser light is any one of linear shape, rectangular shape and planar shape.

20. The method for manufacturing a semiconductor device according to claim 18, wherein the laser light is continuous wave laser light.

21. The method for manufacturing a semiconductor device according to claim 18, wherein the laser light is pulsed laser light.

22. The method for manufacturing a semiconductor device according to claim 18, wherein the patterned semiconductor film is amorphous.

23. The method for manufacturing a semiconductor device according to claim 18, wherein the patterned semiconductor film is crystalline.

24. The method for manufacturing a semiconductor device according to claim 18, wherein a method for etching a part of the semiconductor film is wet etching.

25. The method for manufacturing a semiconductor device according to claim 18, wherein a method for etching a part of the semiconductor film is dry etching.

26. The method for manufacturing a semiconductor device according to claim 18, wherein said semiconductor film is etched to form an active layer of a thin film transistor.

* * * * *